(12) United States Patent
Kondo et al.

(10) Patent No.: US 10,218,922 B2
(45) Date of Patent: Feb. 26, 2019

(54) SOLID-STATE IMAGING DEVICE

(71) Applicant: OLYMPUS CORPORATION, Hachioji-shi, Tokyo (JP)

(72) Inventors: Toru Kondo, Tokyo (JP); Kosei Tamiya, Tokyo (JP); Nobuyuki Watanabe, Yokohama (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 15/865,705

(22) Filed: Jan. 9, 2018

(65) Prior Publication Data

US 2018/0152644 A1    May 31, 2018

(51) Int. Cl.
*H04N 5/345*    (2011.01)
*H01L 27/146*   (2006.01)
(Continued)

(52) U.S. Cl.
CPC ............ *H04N 5/345* (2013.01); *H01L 27/14* (2013.01); *H01L 27/1461* (2013.01);
(Continued)

(58) Field of Classification Search
CPC combination set(s) only.
See application file for complete search history.

(56) References Cited

U.S. PATENT DOCUMENTS

2002/0181799 A1* 12/2002 Matsugu ............ G06K 9/00281
                                                                 382/260
2008/0180534 A1*  7/2008 Murayama ............ H01L 25/167
                                                                 348/208.4
(Continued)

FOREIGN PATENT DOCUMENTS

| JP | 2010-510732 A | 4/2010 |
|---|---|---|
| JP | 2015-128284 A | 7/2015 |
| WO | 2006/022077 A1 | 3/2006 |

OTHER PUBLICATIONS

Berner et al., "A 240×180 10mW 12us Latency Sparse-Output Vision Sensor for Mobile Applications", VLSI Circuits Digest of Technical Papers, 2013, pp. C186-C187, cited in Specification (2 pages).

(Continued)

*Primary Examiner* — Shahbaz Nazrul
(74) *Attorney, Agent, or Firm* — Westerman, Hattori, Daniels & Adrian, LLP

(57) ABSTRACT

A solid-state imaging device includes a first semiconductor substrate to which light is incident; a second semiconductor substrate stacked to the first semiconductor substrate; n first photoelectric conversion devices periodically arranged in the first semiconductor substrate and generating first electric charge signals; n first reading circuits arranged in correspondence with the n first photoelectric conversion devices in the first semiconductor substrate, respectively, each of the n first reading circuits accumulating the first electric charge signal outputting a signal voltage corresponding to the accumulated first electric charge signal as a first pixel signal; a driving circuit sequentially outputting the first pixel signal; m second photoelectric conversion devices periodically arranged in one of the first/second semiconductor substrates and generating second electric charge signals; and m second reading circuits sequentially outputting a second pixel signal, wherein m and n are natural numbers equal to 2 or more than 2.

9 Claims, 16 Drawing Sheets

(51) Int. Cl.
- *H01L 27/14* (2006.01)
- *H04N 5/3745* (2011.01)
- *H04N 5/14* (2006.01)
- *H04N 5/369* (2011.01)

(52) U.S. Cl.
CPC .. *H01L 27/14605* (2013.01); *H01L 27/14607* (2013.01); *H01L 27/14634* (2013.01); *H01L 27/14643* (2013.01); *H04N 5/379* (2018.08); *H04N 5/3745* (2013.01); *H01L 27/14621* (2013.01); *H01L 27/14627* (2013.01); *H01L 27/14636* (2013.01); *H04N 5/144* (2013.01)

(56) References Cited

U.S. PATENT DOCUMENTS

| | | | |
|---|---|---|---|
| 2010/0182468 A1* | 7/2010 | Posch | H04N 5/335 |
| | | | 348/294 |
| 2011/0037895 A1* | 2/2011 | Poon | H04N 5/144 |
| | | | 348/453 |
| 2014/0125994 A1* | 5/2014 | Kim | G01B 11/22 |
| | | | 356/601 |
| 2015/0156428 A1* | 6/2015 | Uchida | H04N 5/3696 |
| | | | 348/294 |
| 2017/0131143 A1* | 5/2017 | Andreou | G01J 1/44 |
| 2018/0262705 A1* | 9/2018 | Park | H04N 5/3745 |

OTHER PUBLICATIONS

International Search Report dated Sep. 15, 2015, issued in counterpart International Application No. PCT/JP2015/070129, w/English translation (3 pages).

* cited by examiner

SOLID-STATE IMAGING DEVICE

This application is a continuation application based on a PCT International Application No. PCT/JP2015/070129, filed on Jul. 14, 2015. The content of the PCT International Application is incorporated herein by reference.

BACKGROUND OF THE INVENTION

Field of the Invention

The present invention relates to a solid-state imaging device.

Description of Related Art

Conventionally, there are motion detection technologies for detecting the motion of an object. In conventional motion detection technologies, a moving object is imaged by taking a difference between images captured at intervals of predetermined frames. Accordingly, in conventional motion detection technologies, the motion of an object can only be detected at the intervals of frames. In other words, the motion of an object cannot be sequentially detected.

In recent years, for example, as disclosed in "A 240×180 10 mW 12 us latency sparse-output vision sensor for mobile applications", VLSI Circuits (VLSIC), 2013 Symposium on, Publication Year: 2013, Page(s): C186-C187 (hereinafter represented as Non-Patent Literature Document 1, short for NPTL 1), a technology relating to a solid-state imaging device has been proposed such that it is possible to realize both of a motion detection for sequentially detecting the motion of an object and an ordinary imaging, by detecting a change of a signal according to the motion of the object. In the solid-state imaging device proposed in NPTL 1, each pixel includes one photoelectric conversion element (photodiode) performing a photoelectric conversion of incident light. The solid-state imaging device can asynchronously perform an active pixel sensor (APS) reading for reading an electric charge signal through ordinary imaging and an address event representation (AER) reading for reading an electric charge signal for detecting a motion.

According to the solid-state imaging device proposed in NPTL 1, when a motion detection is performed, the solid-state imaging device detects a temporal change in the electric charge signal that is photo-electrically converted by a photodiode, and the solid-state imaging device performs an AER reading of a direction in which the electric charge signal changes, in other words, a pulse signal indicating an increase/decrease in the magnitude of an electric charge signal, only from pixels of which the magnitude of the electric charge signal exceeds a predetermined threshold and the solid-state imaging device then outputs the read pulse signal. At this time, address information indicating the position of a pixel outputting a pulse signal, in other words, a pixel detecting the motion of an object is also added to the pulse signal output by the AER reading.

Accordingly, the solid-state imaging device proposed in NPTL 1 can extract the position of a pixel detecting the motion of an object at an asynchronous timing regardless of the timing of a frame in which an electric charge signal is read in an ordinary imaging. In this way, the solid-state imaging device proposed in NPTL 1 can image a moving object at a higher speed than the frame rate of ordinary imaging.

In the solid-state imaging device proposed in NPTL 1, a logic circuit detecting a direction in which an electric charge signal changes and a logic circuit used for adding address information to the pulse signal need to be arranged in each pixel. Accordingly, in the solid-state imaging device proposed in NPTL 1, in accompaniment with the addition of a logic circuit to each pixel, it is necessary to decrease the area of the photodiode. In the solid-state imaging device proposed in NPTL 1, the level of an electric charge signal acquired by the photodiode through a photoelectric conversion of incident light is decreased. In the solid-state imaging device proposed in NPTL 1, according to a decrease in the level of the electric charge signal, which is acquired through ordinary imaging, read through the APS reading, the image quality of a captured ordinary image is degraded.

Including the logic circuit detecting a direction in which the electric charge signal changes and the logic circuit used for adding address information to a pulse signal in each pixel makes it difficult to decrease the area of the photodiode and increase the number of pixels such that it is a factor hampering realization of an increase in the number of pixels in the solid-state imaging device.

A decrease in the level of an electric charge signal that is photo-electrically converted by the photodiode also decreases the level of an electric charge signal used for detecting a temporal change in the motion detection, which leads to a decrease in the accuracy of the motion detection. In order to suppress a decrease in the accuracy of motion detection, it is possible to furtherly include an amplification circuit (amplifier) amplifying and outputting a pulse signal. However, in such a case, the additionally included amplifier also includes a logic circuit such that it is necessary to furtherly decrease the area of the photodiode. As a result, a degradation in the image quality in ordinary imaging and difficulty in enhancing image resolution in the solid-state imaging device as described above become more significant.

SUMMARY OF THE INVENTION

According to a first aspect of the present invention, a solid-state imaging device includes a first semiconductor substrate to which light is incident; a second semiconductor substrate that is stacked on a surface of the first semiconductor substrate, the surface being opposite with respect to a surface on which the light is incident to the first semiconductor substrate; n first photoelectric conversion devices that are periodically arranged in the first semiconductor substrate, the n first photoelectric conversion devices generating first electric charge signals acquired by performing photoelectric conversion of the incident light; n first reading circuits arranged in correspondence with each of the n first photoelectric conversion devices in the first semiconductor substrate, each of the n first reading circuits accumulating the first electric charge signal generated by a corresponding one of the n first photoelectric conversion devices, and each of the n first reading circuits outputting a signal voltage corresponding to the accumulated first electric charge signal as a first pixel signal; a driving circuit that outputs the first pixel signal by sequentially driving each of the n first reading circuits; m second photoelectric conversion devices that are periodically arranged in one of the first semiconductor substrate and the second semiconductor substrate, the m second photoelectric conversion devices generating second electric charge signals by performing photoelectric conversion of the incident light; and m second reading circuits that sequentially output a second pixel signal indicating a change in the second electric charge signal, the second electric charge signal being generated by a corresponding second photoelectric conversion device among the m second photoelectric conversion devices. Each of the m second reading circuits includes a detection circuit that detects a temporal change of the second electric charge signal generated by the corresponding one of the second photoelectric conversion devices and the detection circuit outputs an event signal indicating a direction of a change when a change exceeding a predetermined threshold is detected; and a pixel signal generating circuit that is arranged in the second semiconductor substrate and the pixel signal generating circuit outputs the second pixel signal, the second pixel being generated by adding address information indicating a position at which the corresponding one of the second photoelectric conversion devices is arranged to the event signal. N is a natural number equal to 2 or more than 2, and m is a natural number equal to 2 or more than 2.

According to a second aspect of the present invention, in the solid-state imaging device according to the first aspect, each of the m second reading circuits may further include an amplification circuit that is arranged in the second semiconductor substrate, the amplification circuit amplifying the second electric charge signal generated by the corresponding one of the second photoelectric conversion devices, and the detection circuit may detect a change in the second electric charge signal after being amplified by the amplification circuit.

According to a third aspect of the present invention, in the solid-state imaging device according to the first aspect, m may be smaller than n, and an area in which each of the m second photoelectric conversion devices receives the light may be larger than an area in which each of the n first photoelectric conversion devices receives the light.

According to a fourth aspect of the present invention, in the solid-state imaging device according to the first aspect, each of the m second photoelectric conversion devices may be arranged in the second semiconductor substrate, and each of the m second photoelectric conversion devices may generate a second electric charge signal acquired by performing the photoelectric conversion of light transmitted through corresponding p first photoelectric conversion devices among the n first photoelectric conversion devices, and p may be a natural number equal to 1 or more than 1.

According to a fifth aspect of the present invention, the solid-state imaging device according to the first aspect may furtherly include a connection part that is formed between the first semiconductor substrate and the second semiconductor substrate, the connection part electrically connecting a circuit element of the first semiconductor substrate and a circuit element of the second semiconductor substrate, m may be smaller than n, each of the m second photoelectric conversion devices may be arranged in the first semiconductor substrate, and the connection part may electrically connect the detection circuit included in each of the m second reading circuits and a corresponding one of the second photoelectric conversion devices.

According to a sixth aspect of the present invention, the solid-state imaging device according to the first aspect may furtherly include a connection part that is formed between the first semiconductor substrate and the second semiconductor substrate, the connection part electrically connecting a circuit element of the first semiconductor substrate and a circuit element of the second semiconductor substrate, the second photoelectric conversion devices may be the first photoelectric conversion devices, each of the m second reading circuits may sequentially output the second pixel signal indicating a change in the first electric charge signal, the first electric charge signal being generated by corresponding s first photoelectric conversion devices among the n first photoelectric conversion devices, the detection circuit included in each of them second reading circuits may detect a temporal change in the first electric charge signal, the first electric charge signal being generated by corresponding s first photoelectric conversion devices, and the detection circuit may output the event signal when the temporal change exceeding a predetermined threshold is detected, the connection part may electrically connect the detection circuit included in each of the m second reading circuits and corresponding s first photoelectric conversion devices, and s may be a natural number equal to 1 or more than 1.

According to a seventh aspect of the present invention, in the solid-state imaging device according to the sixth aspect, m may be smaller than n, s may be a natural number equal to 2 or more than 2, each of the m second reading circuits may furtherly include an addition circuit that adds each of the first electric charge signals, the first electric charge signals being generated by the corresponding s first photoelectric conversion devices, and the detection circuit may detect a change in the first electric charge signal after the addition performed by the addition circuit.

According to an eighth aspect of the present invention, in the solid-state imaging device according to the seventh aspect, each of the m second reading circuits may furtherly include an amplification circuit that is arranged in the second semiconductor substrate and the amplification circuit may amplify the first electric charge signal after the addition performed by the addition circuit, and the detection circuit may detect a change in the first electric charge signal after the amplification performed by the amplification circuit.

According to a ninth aspect of the present invention, in the solid-state imaging device according to the seventh aspect, the addition circuit may be arranged in the first semiconductor substrate, and the connection part may electrically connect the detection circuit included in each of them second reading circuits and a corresponding addition circuit.

DETAILED DESCRIPTION OF THE INVENTION

First Embodiment

Figure 1:
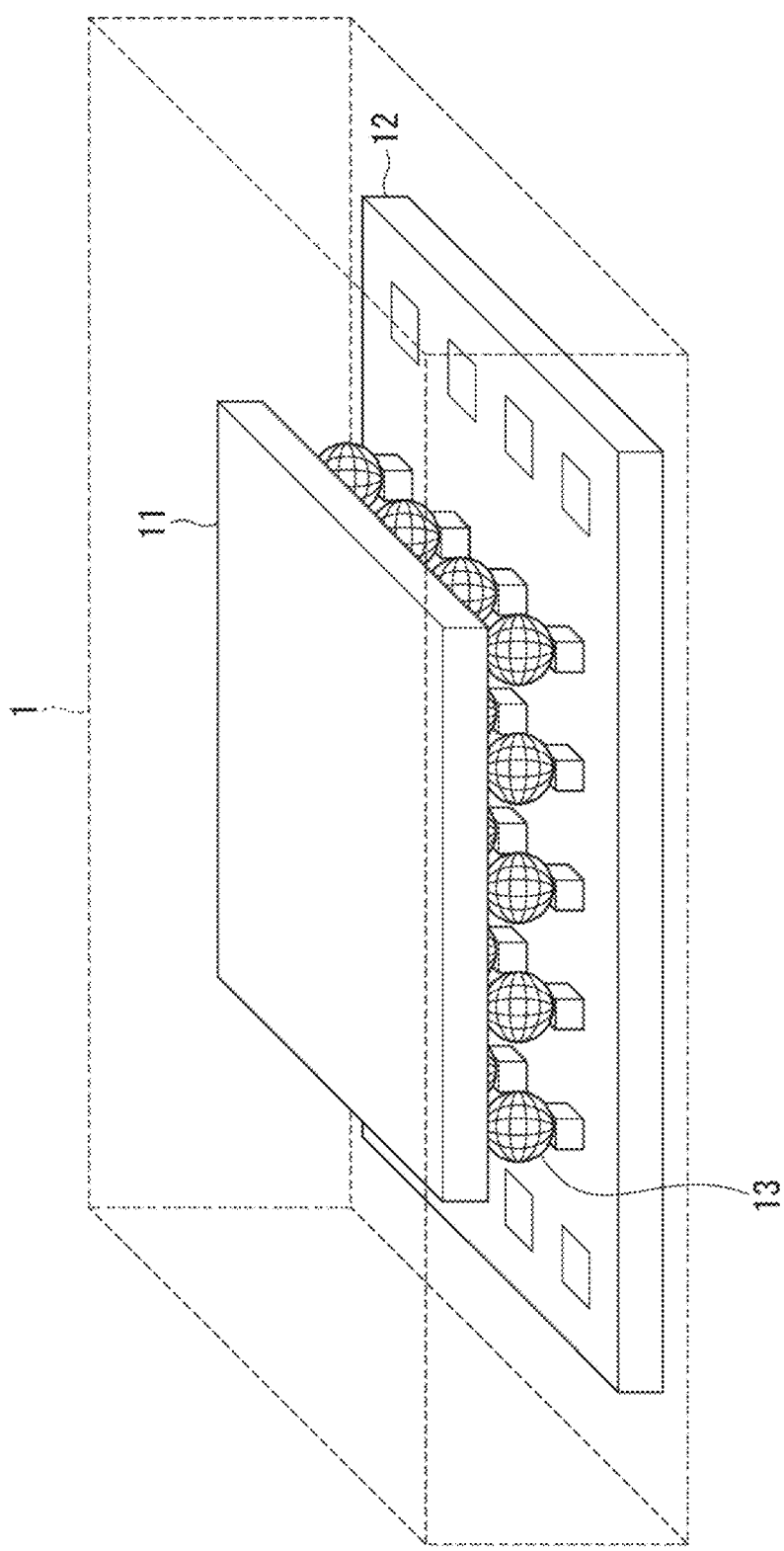
FIG. 1 is an outline diagram showing a schematic configuration of a solid-state imaging device according to a first embodiment of the present invention.

Hereinafter, an embodiment of the present invention will be described with reference to the drawings. FIG. 1 is an outline diagram showing a schematic configuration of a solid-state imaging device according to a first embodiment of the present invention. The solid-state imaging device 1 according to the first embodiment is configured by stacking (bonding) a plurality of semiconductor substrates. In the case shown in FIG. 1, in the solid-state imaging device 1, a first semiconductor substrate 11 and a second semiconductor substrate 12 are bonded by a chip connecting part 13.

The solid-state imaging device 1 forms circuits used for realizing the function of the solid-state imaging device 1 on one of the first semiconductor substrate 11 and the second semiconductor substrate 12. As the circuits used for realizing the function of the solid-state imaging device 1, a pixel array unit in which pixels are arranged in a two-dimensional matrix pattern, and a driving circuit used for driving pixels within the pixel array unit, and the like are included. In the pixel array, each of the pixel includes a photoelectric conversion device such as a photodiode performing photoelectric conversion of incident light (rays) and a reading circuit reading an electric charge signal generated by the photoelectric conversion device.

Each of the circuits used for realizing the function of the solid-state imaging device 1 may be not only configured to be formed on one of the first semiconductor substrate 11 and the second semiconductor substrate 12 but also configured to be formed on both the first semiconductor substrate 11 and the second semiconductor substrate 12.

Each of the circuits used for realizing the function of the solid-state imaging device 1 formed on respective semiconductor substrates are electrically connected together by chip connecting parts 13. The circuits formed on the first semiconductor substrate 11 and the circuits formed on the second semiconductor substrate 12 perform transmission and reception of signals through the chip connecting parts 13, respectively.

The chip connecting parts 13, for example, use micro bumps produced using a vapor deposition method or a plating method or the like. The method of connecting the circuits used for realizing the function of the solid-state imaging device 1 formed on respective semiconductor substrates is not limited to the method of using the micro bumps but, for example, may be a method using through silicon electrodes (through-silicon-via (TSV)).

Figure 2:
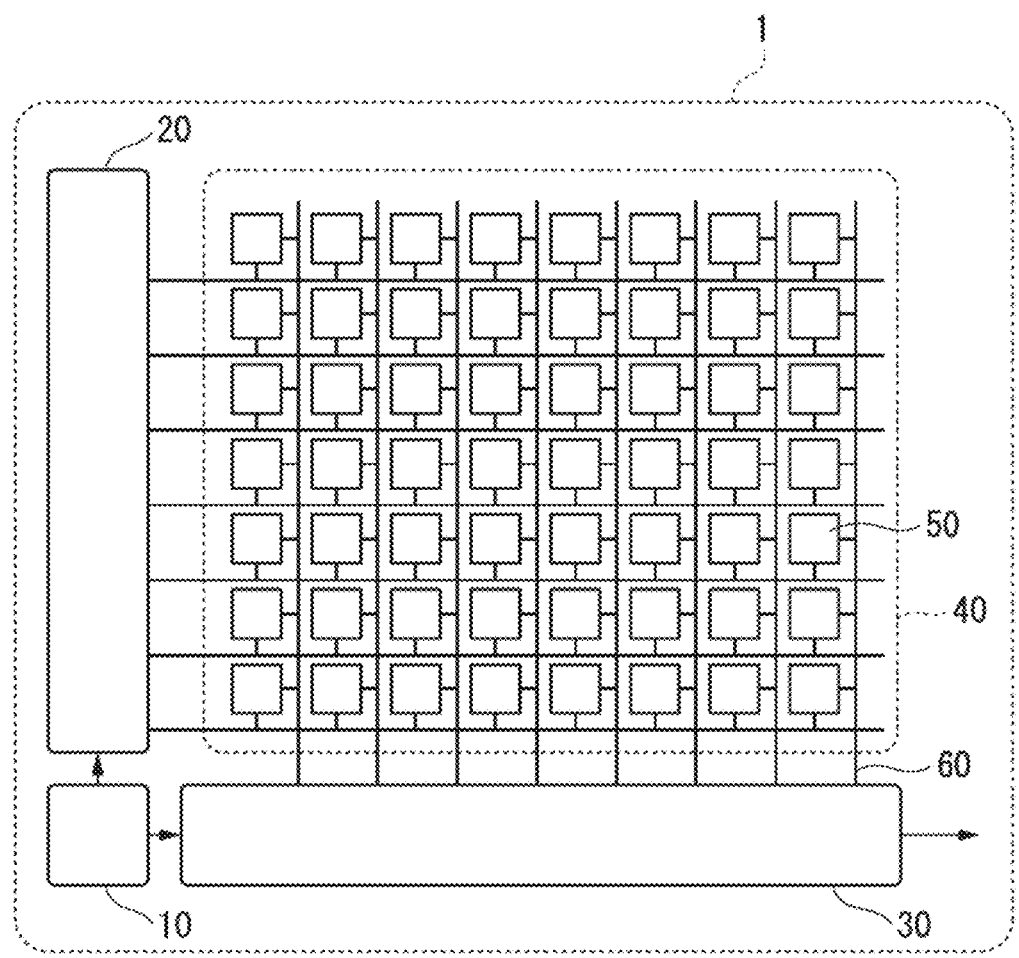
FIG. 2 is a block diagram showing a schematic configuration of the solid-state imaging device according to the first embodiment of the present invention.

Next, an example of the configuration of the solid-state imaging device 1 according to the first embodiment will be described. FIG. 2 is a block diagram showing a schematic configuration of the solid-state imaging device 1 according to the first embodiment of the present invention. In FIG. 2, the solid-state imaging device 1 includes a control circuit 10; a vertical scanning circuit 20; a horizontal scanning circuit 30; and a pixel array unit 40 in which a plurality of pixels 50 are arranged. In the solid-state imaging device 1 shown in FIG. 1, an example of the pixel array unit 40 in which the plurality of pixels 50 are two-dimensionally arranged in 7 rows×8 columns.

The control circuit 10 controls the vertical scanning circuit 20 and the horizontal scanning circuit 30.

The vertical scanning circuit 20 is a driving circuit that controls each pixel 50 disposed within the pixel array unit 40 in accordance with the control of the control circuit 10 and outputs the pixel signal of each pixel 50 to a vertical signal line 60. The vertical scanning circuit 20 outputs control signals used for driving the pixels 50 for each row of the pixels 50 included in the pixel array unit 40.

The horizontal scanning circuit 30 is a driving circuit that sequentially outputs pixel signals output for each row from the pixels 50 disposed in the pixel array unit 40 to the outside of the solid-state imaging device 1.

Each pixel 50 arranged within the pixel array unit 40 generates an electric charge signal acquired by performing a photoelectric conversion of incident light (rays). Among the pixels 50 arranged within the pixel array unit 40, there are some pixels 50 configured to generate electric charge signals through ordinary imaging and some pixels 50 configured to generate electric charge signals used for motion detection, respectively.

The pixel 50, configured to generate an electric charge signal through ordinary imaging, outputs a pixel signal in accordance with the generated electric charge signal to the vertical signal line 60 for each row by the active pixel sensor (APS) reading (hereinafter, referred to as "ordinary reading"), the APS reading being performed in accordance with a control signal input from the vertical scanning circuit 20. Then, the pixel signal of each row output to the vertical signal line 60 is output to the outside of the solid-state imaging device 1 under the control of the horizontal scanning circuit 30. In other words, the pixel signal output from the pixel 50 configured to generate an electric charge signal through ordinary imaging is output to the outside of the solid-state imaging device 1 for each frame of the ordinary imaging. In the description below, the pixel 50 configured to generate an electric charge signal through ordinary imaging, in other words, the pixel 50 outputting a pixel signal of the ordinary imaging will be referred to as an "ordinary pixel 51".

The pixel 50, configured to generate an electric charge signal used for motion detection, outputs a pulse signal without being synchronized (in other words, outputs a pulse signal asynchronously) with the driving of the ordinary pixels 51 performed by the vertical scanning circuit 20 by the address event representation (AER) reading (hereinafter, referred to as "motion detection reading"), wherein the pulse signal represents a temporal change of an electric charge signal and the direction of the change. At this time, the pixel 50 configured to generate the electric charge signal used for motion detection adds address information indicating the position of the own pixel 50 to the pulse signal and the pixel 50 outputs a resultant signal as a pixel signal. In the description below, the pixel 50 configured to generate an electric charge signal used for motion detection, in other words, the pixel 50 outputting a pixel signal of motion detection will be referred to as a "motion detection pixel 52".

Circuit elements configuring each of the ordinary pixel 51 and the motion detection pixel 52 are formed in any one of the first semiconductor substrate 11 and the second semiconductor substrate 12 or both the semiconductor substrates, and circuit elements configuring each of the ordinary pixel 51 and the motion detection pixel 52 are connected inside the pixel array unit 40 by the chip connecting parts 13.

Figure 3A:
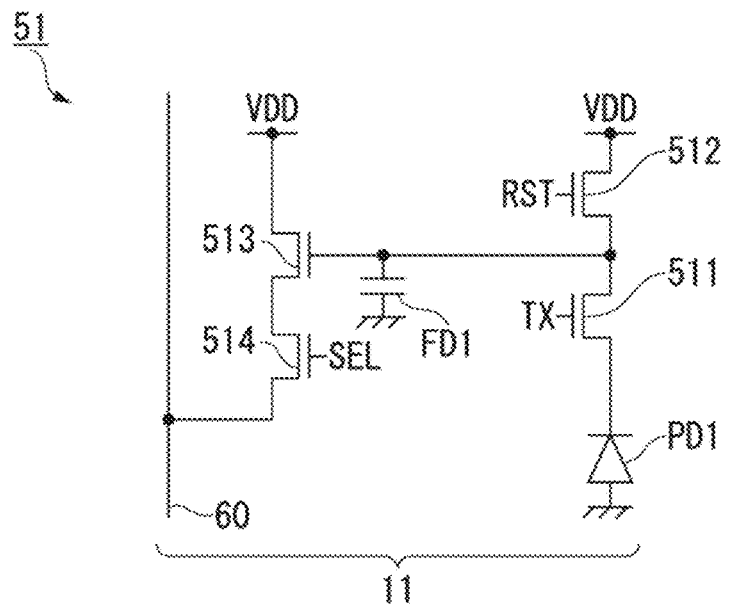
FIG. 3A is a circuit diagram showing an example of the configuration of a pixel in the solid-state imaging device according to the first embodiment of the present invention.
Figure 3B:
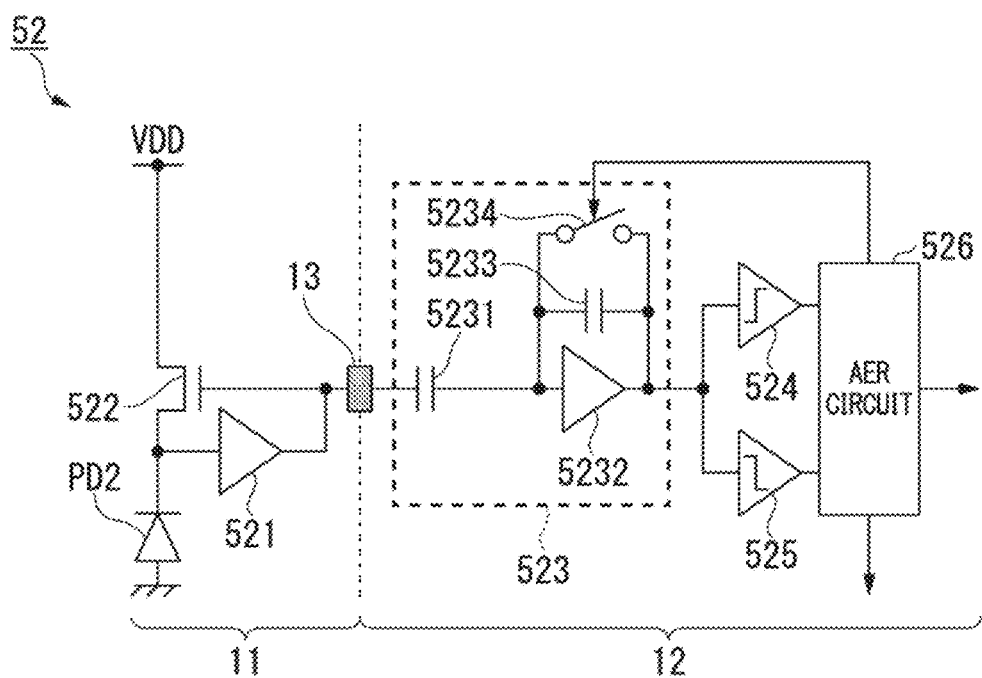
FIG. 3B is a circuit diagram showing an example of the configuration of a pixel in the solid-state imaging device according to the first embodiment of the present invention.

Next, the configurations of the ordinary pixel 51 and the motion detection pixel 52 arranged inside the pixel array unit 40 in the solid-state imaging device 1 according to the first embodiment will be described. FIGS. 3A and 3B are circuit diagrams showing examples of the configurations of the pixels 50 (the ordinary pixel 51 and the motion detection pixel 52) in the solid-state imaging device 1 according to the first embodiment of the present invention. FIG. 3A shows an example of the configuration of the ordinary pixel 51 arranged inside the pixel array unit 40 of the solid-state imaging device 1, and FIG. 3B shows an example of the configuration of the motion detection pixel 52 arranged inside the pixel array unit 40 of the solid-state imaging device 1.

First, the configuration of the ordinary pixel 51 will be described with reference to FIG. 3A. As shown in FIG. 3A, the ordinary pixel 51 includes: a photoelectric conversion device PD1; a charge transfer transistor 511; a pixel reset transistor 512; an amplification transistor 513; and a selection transistor 514. In FIG. 3A, node capacitance FD1 that is capacitance accompanying a node connected to the gate terminal of the amplification transistor 513 included in the ordinary pixel 51 is denoted using a symbol of a capacitor as a circuit element of the ordinary pixel 51.

In the ordinary pixel 51, a reading circuit configured to read a pixel signal corresponding to an electric charge signal generated by the photoelectric conversion device PD1 is configured by the node capacitance FD1, and a group of the charge transfer transistor 511, the pixel reset transistor 512, the amplification transistor 513, and the selection transistor 514. In the solid-state imaging device 1, the photoelectric conversion device PD1 and the reading circuit are formed in the first semiconductor substrate 11.

The photoelectric conversion device PD1 is a photodiode generating an electric charge signal by performing a photoelectric conversion of incident light (rays) and storing the generated electric charge signal.

The charge transfer transistor 511 transmits an electric charge signal generated and stored by the photoelectric conversion device PD1 to the gate terminal of the amplification transistor 513 in accordance with a control signal TX input from the vertical scanning circuit 20. Accordingly, the electric charge signal transmitted by the charge transfer transistor 511 is accumulated in the node capacitance FD1.

The amplification transistor 513 outputs a signal voltage corresponding to an electric charge signal transmitted to the gate terminal, in other words, an electric charge signal accumulated in the node capacitance FD1 to the selection transistor 514.

The pixel reset transistor 512 resets an electric charge signal inside the ordinary pixel 51 to a power source voltage VDD in accordance with a control signal RST input from the vertical scanning circuit 20.

The selection transistor 514 outputs a signal voltage output from the amplification transistor 513 to the vertical signal line 60 as a pixel signal of the ordinary pixel 51 in accordance with a control signal SEL input from the vertical scanning circuit 20. Accordingly, a pixel signal corresponding to an electric charge signal generated by the photoelectric conversion device PD1 included in the ordinary pixel 51 is read into the vertical signal line 60.

According to such a configuration, in the ordinary pixel 51, each signal voltage corresponding to an electric charge signal acquired through a photoelectric conversion of incident light performed by the photoelectric conversion device PD1 is read into the vertical signal line 60 as a pixel signal.

Subsequently, the configuration of the motion detection pixel 52 will be described with reference to FIG. 3B. As shown in FIG. 3B, the motion detection pixel 52 includes: a photoelectric conversion device PD2; an amplifier 521; a bias transistor 522; a switched capacitor amplifier circuit 523; a pair of a threshold amplifier 524 and a threshold amplifier 525; and an AER circuit 526. The switched capacitor amplifier circuit 523 includes a capacitor 5231, an amplifier 5232, a capacitor 5233, and a switch 5234.

In the motion detection pixel 52, the amplifier 521 and the bias transistor 522 configure an output circuit that outputs an electric charge signal generated by the photoelectric conversion device PD2. In the motion detection pixel 52, the switched capacitor amplifier circuit 523, the threshold amplifier 524, the threshold amplifier 525, and the AER circuit 526 configure a reading circuit that reads an electric charge signal generated by the photoelectric conversion device PD2. In the solid-state imaging device 1, the photoelectric conversion device PD2 and the output circuit are formed in the first semiconductor substrate 11, and the reading circuit is formed in the second semiconductor substrate 12.

The photoelectric conversion device PD2, similar to the photoelectric conversion device PD1 included in the ordinary pixel 51, is a photodiode generating an electric charge signal by performing a photoelectric conversion of incident light (rays) and storing the generated electric charge signal. The photoelectric conversion device PD2 sequentially outputs generated electric charge signals to the amplifier 521.

The amplifier 521 amplifies an electric charge signal that is generated and output by the photoelectric conversion device PD2. The amplifier 521 outputs an amplified electric charge signal to the switched capacitor amplifier circuit 523 via the chip connecting part 13. Accordingly, a change in the electric charge signal generated by the photoelectric conversion device PD2 is input to the switched capacitor amplifier circuit 523. The amplifier 521 transmits an amplified electric charge signal to the gate terminal of the bias transistor 522.

The bias transistor 522 performs control such that a current flowing through the photoelectric conversion device PD2 is constant in accordance with an electric charge signal transmitted to the gate terminal. Accordingly, in a case where the electric charge signal generated by the photoelectric conversion device PD2 changes, the magnitude of the electric charge signal is sequentially stabilized to a magnitude after the change. In other words, the output of the photoelectric conversion device PD2 is clipped.

The switched capacitor amplifier circuit 523 converts a change in the electric charge signal input from the amplifier 521 through the chip connecting part 13, that is, the switched capacitor amplifier circuit 523 converts an increase/decrease in the electric charge signal generated by the photoelectric conversion device PD2 into a voltage signal of a predetermined voltage range and the switched capacitor amplifier circuit 523 outputs the converted voltage signal to the threshold amplifier 524 and the threshold amplifier 525. The operation of the switched capacitor amplifier circuit 523 is reset by the AER circuit 526.

More specifically, an electric charge signal input from the amplifier 521 via the chip connecting part 13 is input to a first terminal of the capacitor 5231 to be accumulated. Accordingly, a voltage signal of a voltage corresponding to the accumulated electric charge signal is output from a second terminal of the capacitor 5231 and is output to the amplifier 5232.

The amplifier 5232 amplifies the voltage of the input voltage signal and the amplifier 5232 outputs the amplified voltage signal to the threshold amplifier 524 and the threshold amplifier 525 as the output of the switched capacitor amplifier circuit 523. The voltage signal output by the amplifier 5232 is input to the first terminal of the capacitor 5233 to be accumulated. Accordingly, a signal of a voltage corresponding to the accumulated voltage signal is output from the second terminal of the capacitor 5233 to the amplifier 5232 as a feedback signal. The amplifier 5232 continuously outputs a voltage signal of a constant voltage corresponding to the voltage of the feedback signal. In other words, the amplifier 5232 continuously outputs a voltage signal of a voltage to the threshold amplifier 524 and the threshold amplifier 525, the voltage signal of the voltage corresponding to the electric charge signal input to the switched capacitor amplifier circuit 523 from the amplifier 521 through the chip connecting part 13. The voltage signal output by the amplifier 5232 to the threshold amplifier 524 and the threshold amplifier 525 is a signal of a voltage indicating the magnitude of an increase/decrease in the electric charge signal generated by the photoelectric conversion device PD2.

The output terminal (also the first terminal of the capacitor 5233) of the amplifier 5232 is connected to a first terminal of the switch 5234, and the input terminal (also the second terminal of the capacitor 5233) of the amplifier 5232 is connected to a second terminal of the switch 5234. The switch 5234 is controlled to be short-circuited or open in accordance with a reset signal that is output from the AER circuit 526 and input to a control terminal. When the switch 5234 is controlled to be short-circuited according to a reset signal output from the AER circuit 526, the switch 5234 forms a short circuit of the first terminal and the second terminal. Accordingly, both terminals of the capacitor 5233 are short-circuited and the voltages of both the terminals of the capacitor 5233 become a same voltage to be reset, while the amplification operation of a voltage signal that is performed by the amplifier 5232 is reset as well.

In FIG. 3B, while the switched capacitor amplifier circuit 523 configured by the capacitor 5231, the amplifier 5232, the capacitor 5233, and the switch 5234 is shown as an example, the configuration of the switched capacitor amplifier circuit 523 is not limited to the configuration shown in FIG. 3B.

Each of the threshold amplifier 524 and the threshold amplifier 525 detects both of a change in the voltage and a direction of the change in the voltage regarding the voltage signal input from the amplifier 5232 disposed inside the switched capacitor amplifier circuit 523.

More specifically, each of the threshold amplifier 524 and the threshold amplifier 525 compares the voltage of a voltage signal input from the amplifier 5232 disposed inside the switched capacitor amplifier circuit 523 with a predetermined threshold voltage. Then, in a case where the voltage of the input voltage signal exceeds the threshold voltage, each of the threshold amplifier 524 and the threshold amplifier 525 outputs an event signal indicating the presence of a change exceeding the threshold voltage to the AER circuit 526.

In each of the threshold amplifier 524 and the threshold amplifier 525, one of a positive-direction voltage and a negative-direction voltage set in advance is set as the threshold voltage. In the configuration shown in FIG. 3B, a positive-direction voltage having a predetermined voltage value is set in the threshold amplifier 524 as a threshold voltage, and a negative-direction voltage having a predetermined voltage value is set in the threshold amplifier 525 as a threshold voltage. Accordingly, the threshold amplifier 524 detects whether or not the voltage of a voltage signal input from the amplifier 5232 has changed in a positive direction (an increasing direction) more than the positive-direction threshold voltage. The threshold amplifier 525 detects whether or not the voltage of a voltage signal input from the amplifier 5232 has changed in a negative direction (a decreasing direction) more than the negative-direction threshold voltage.

In this way, by employing the configuration of the threshold amplifier 524 and the threshold amplifier 525, a change of a voltage signal indicating that the voltage signal exceeding the threshold voltage and the direction of the change are detected, the voltage signal being converted into the predetermined voltage range by the switched capacitor amplifier circuit 523. This is equivalent to the detection of a change of the electric charge signal generated by the photoelectric conversion device PD2 indicating that the electric charge signal exceeding a predetermined threshold and the direction of the change. An event signal output by each of the threshold amplifier 524 and the threshold amplifier 525 to the AER circuit 526 represents a change in the electric charge signal generated by the photoelectric conversion device PD2 and the direction of the change (a positive direction or a negative direction). In other words, in a case where the threshold amplifier 524 outputs the event signal, it represents that there is a change of the electric charge signal generated by the photoelectric conversion device PD2 in the positive direction exceeding a predetermined threshold. In a case where the threshold amplifier 525 outputs the event signal, it represents that there is a change of the electric charge signal generated by the photoelectric conversion device PD2 in the negative direction exceeding a predetermined threshold.

In the configuration shown in FIG. 3B, by using the configuration of the switched capacitor amplifier circuit 523, and the pair of the threshold amplifier 524 and the threshold amplifier 525, a temporal change in the electric charge signal generated by the photoelectric conversion device PD2 is detected. However, the configuration used for detecting a temporal change of the electric charge signal generated by the photoelectric conversion device PD2 is not limited to the configuration shown in FIG. 3B. For example, a configuration in which a temporal change of the electric charge signal generated by the photoelectric conversion device PD2 is detected by the threshold amplifier 524 and the threshold amplifier 525 may be employed.

The AER circuit 526 detects one of the positive direction and the negative direction in which the electric charge signal generated by the photoelectric conversion device PD2 changes based on an event signal input from each of the threshold amplifier 524 and the threshold amplifier 525. In other words, the AER circuit 526 detects an increase/decrease in the magnitude of the electric charge signal based on the event signal input from each of the threshold amplifier 524 and the threshold amplifier 525. Then, the AER circuit 526 generates a pulse signal that represents a result of the detection. For example, a positive-direction pulse signal is generated in a case where an electric charge signal generated by the photoelectric conversion device PD2 changes in the positive direction (increasing direction), and a negative-direction pulse signal is generated in a case where an electric charge signal generated by the photoelectric conversion device PD2 changes in the negative direction (decreasing direction). Then, the AER circuit 526 adds address information indicating the position of the own motion detection pixel 52 to the generated pulse signal and the AER circuit 526 outputs a resultant pulse signal as a pixel signal. In the description below, for being discriminated from a pixel signal output by the ordinary pixel 51, a pixel signal output by the AER circuit 526, in other words, the motion detection pixel 52 will be referred to as an "event pixel signal.

According to such a configuration, the motion detection pixel 52 detects a change in the electric charge signal acquired by the photoelectric conversion device PD2 performing a photoelectric conversion of incident light and the direction of the change and outputs the detected information and address information indicating the position of the motion detection pixel 52 for each motion detection pixel 52.

While an event pixel signal output by the motion detection pixel 52, as described above, may be configured to be output for each motion detection pixel 52, the configuration of each motion detection pixel 52 for outputting an event pixel signal is not particularly limited. For example, each motion detection pixel 52 may be configured to output an event pixel signal through the horizontal scanning circuit 30. An event pixel signal may be configured to be output in a format arranged for each predetermined range inside the pixel array unit 40.

While a configuration in which the AER circuit 526 adds address information to a generated pulse signal and the AER circuit 526 outputs a resultant pulse signal as an event pixel signal in the motion detection pixel 52 has been shown as an example, the configuration for adding address information to a pulse signal is not limited to the AER circuit 526. For example, a configuration may be employed in which a configuration element, which is not shown in the drawing, included in the solid-state imaging device 1 adds address information indicating the position of a motion detection pixel 52 that has output a pulse signal to the pulse signal output by the AER circuit 526 included in each motion detection pixel 52 and outputs a resultant signal as an event pixel signal.

A configuration in which, in the motion detection pixel 52, an electric charge generated by the photoelectric conversion device PD2 is amplified by the switched capacitor amplifier circuit 523 and then is converted into a voltage signal in the predetermined voltage range has been shown as an example. However, in the motion detection pixel 52, the configuration for converting an electric charge signal generated by the photoelectric conversion device PD2 into a voltage signal of a predetermined voltage range is not limited to the configuration using the switched capacitor amplifier circuit 523. For example, the motion detection pixel 52 may have a configuration without the amplifier 5232 included in the switched capacitor amplifier circuit 523, that is, the motion detection pixel 52 may be configured such that an electric charge signal generated by the photoelectric conversion device PD2 is converted into a voltage signal in a predetermined voltage range by a so-called switched capacitor circuit. In such a case, the motion detection pixel 52 may detect a temporal change in the electric charge signal generated by the photoelectric conversion device PD2 by using a configuration of the switched capacitor circuit, and the pair of the threshold amplifier 524 and the threshold amplifier 525.

First Arrangement Example

Figure 4:
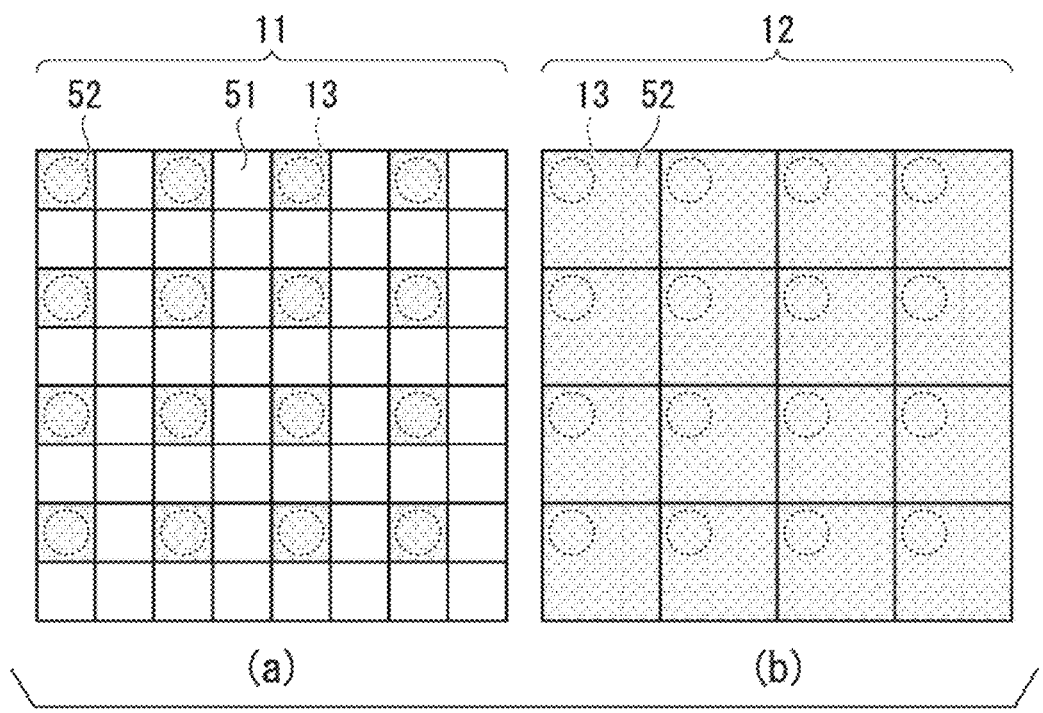
FIG. 4 is a diagram schematically showing an example of the arrangement of pixels in the solid-state imaging device according to the first embodiment of the present invention.

Next, an example of the arrangement of ordinary pixels 51 and motion detection pixels 52 inside the pixel array unit 40 of the solid-state imaging device 1 according to the first embodiment will be described. FIG. 4 is a diagram schematically showing an example (first arrangement example) of the arrangement of pixels 50 (ordinary pixels 51 and motion detection pixels 52) of the solid-state imaging device 1 according to the first embodiment of the present invention. FIG. 4 shows an example of the arrangement of ordinary pixels 51 and motion detection pixels 52 disposed inside the pixel array unit 40 formed in semiconductor substrates configuring the solid-state imaging device 1.

In the first arrangement example of pixels of the solid-state imaging device 1, the pixels 50, that is, ordinary pixels 51 and motion detection pixels 52 are arranged in a planar shape. At this time, in the solid-state imaging device 1, as described above, the ordinary pixels 51 are formed in the first semiconductor substrate 11, and the motion detection pixels 52 are formed to be divided into the first semiconductor substrate 11 and the second semiconductor substrate 12. A part (a) of FIG. 4 shows an example in which pixels 50 (ordinary pixels 51 and motion detection pixels 52) are arranged inside the area of the pixel array unit 40 of the first semiconductor substrate 11 configuring the solid-state imaging device 1. A part of (b) of FIG. 4 shows an example in which motion detection pixels 52 are arranged inside the area of the pixel array unit 40 of the second semiconductor substrate 12 configuring the solid-state imaging device 1.

More specifically, as shown in the part (a) of FIG. 4, in a planar area of the pixel array unit 40 of the first semiconductor substrate 11, an ordinary pixel 51, a photoelectric conversion device PD2, and an output circuit of a motion detection pixel 52 are periodically arranged in a row direction and a column direction. At this time, the ordinary pixels 51, as shown in the part (a) of FIG. 4, are arranged more than the motion detection pixels 52. In the part (a) of FIG. 4, an ordinary pixel 51 and a photoelectric conversion device PD2 and an output circuit of a motion detection pixel 52 are alternately arranged.

As shown in the part (b) of FIG. 4, in a planar area of the pixel array unit 40 of the second semiconductor substrate 12, reading circuits of the motion detection pixels 52 are arranged to correspond to the photoelectric conversion device PD2 and the output circuit of the motion detection pixels 52 arranged in the first semiconductor substrate 11, respectively. At this time, the reading circuit of each motion detection pixel 52, as shown in the part (b) of FIG. 4, is formed to include a planar area of the pixel array unit 40 of the second semiconductor substrate 12 corresponding to the ordinary pixel 51 arranged in the first semiconductor substrate 11. In other words, in the solid-state imaging device 1, the motion detection pixel 52 is formed by using an area of the second semiconductor substrate 12 that is not used for the formation of the ordinary pixel 51, since the motion detection pixel 52 requires a large area at the time of formation due to its configuration formed by more circuit elements than those of the ordinary pixel 51. More specifically, in the second semiconductor substrate 12 that is stacked on a surface disposed on the side opposite to a surface disposed on the side on which light is incident to the ordinary pixel 51, the reading circuit of each motion detection pixel 52 is formed to include an area overlapping the area of the ordinary pixel 51 formed in the first semiconductor substrate 11. Then, as shown in the part (a) of FIG. 4 and the part (b) of FIG. 4, the output circuit formed in the first semiconductor substrate 11 and the reading circuit formed in the second semiconductor substrate 12 are electrically connected using the chip connecting part 13.

Figure 5:
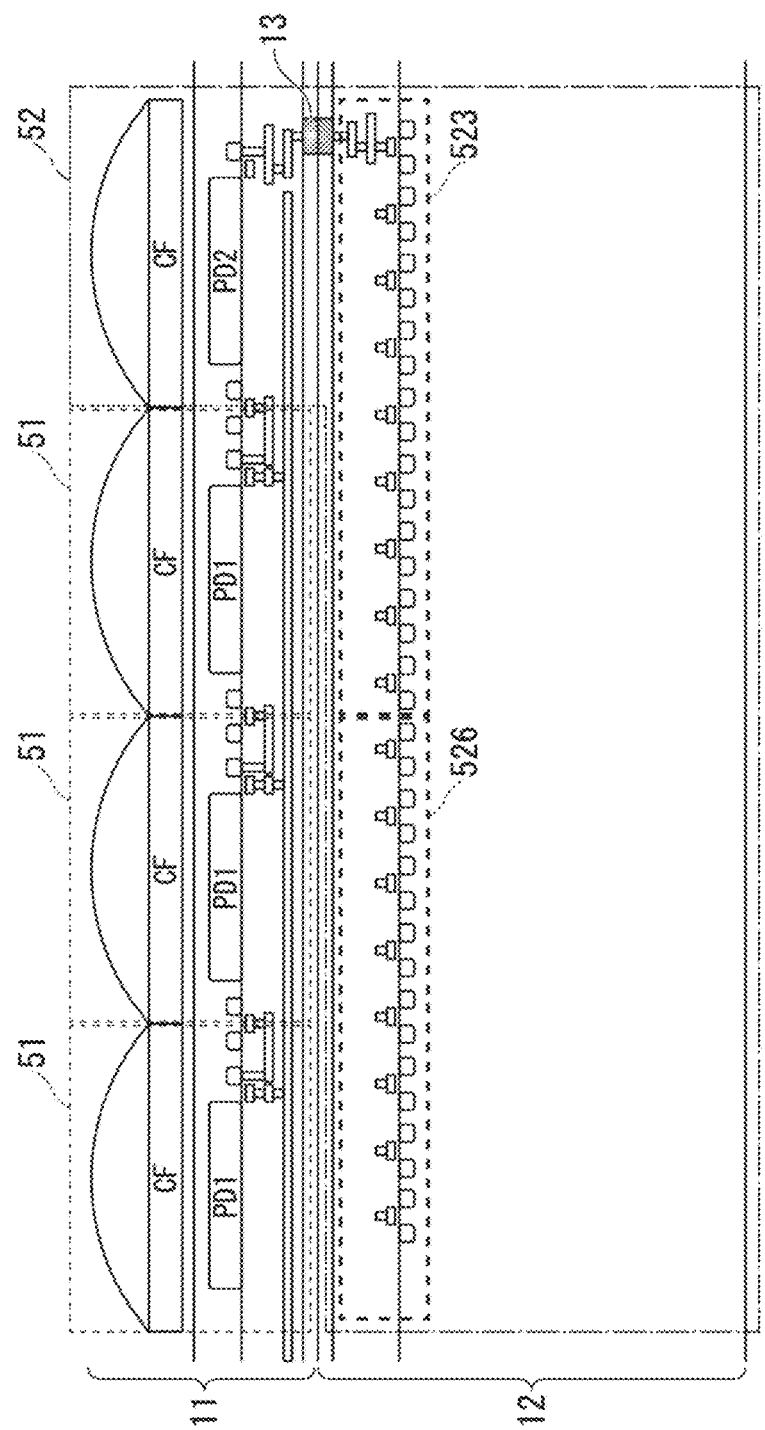
FIG. 5 is a cross-sectional view showing an example of the structure of the solid-state imaging device according to the first embodiment of the present invention.

The structure of the solid-state imaging device 1 according to the first embodiment will be described. FIG. 5 is a cross-sectional view showing an example of the structure of the solid-state imaging device 1 according to the first embodiment of the present invention. FIG. 5 shows the vertical structure of a part of the pixel array unit 40 of a case where ordinary pixels 51 and motion detection pixels 52 are arranged as in the first arrangement example in the solid-state imaging device 1. More specifically, the vertical structure of three ordinary pixels 51 formed in the first semiconductor substrate 11 and one motion detection pixel 52 formed in the first semiconductor substrate 11 and the second semiconductor substrate 12 is shown.

As described above, in the solid-state imaging device 1, the reading circuit of each motion detection pixel 52 is formed in an area of the second semiconductor substrate 12 that includes an area overlapping the area of the ordinary pixel 51 formed in the first semiconductor substrate 11. FIG. 5 shows a state in which a switched capacitor amplifier circuit 523 and an AER circuit 526 included in the reading circuit of the motion detection pixel 52 formed inside the second semiconductor substrate 12.

As described above, in the solid-state imaging device 1, the output circuit of each motion detection pixel 52 and a corresponding reading circuit of the motion detection pixel 52 are electrically connected using the chip connecting part 13 formed between the first semiconductor substrate 11 and the second semiconductor substrate 12.

In the vertical structure of the solid-state imaging device 1 shown in FIG. 5, the configuration of the solid-state imaging device 1 in which color filters CF are attached to the side of the ordinary pixels 51 and the motion detection pixel 52 to which light is incident is shown. In other words, the configuration of the solid-state imaging device 1 that outputs pixel signals used for generating a color image in ordinary imaging is shown. The color filters CF attached to the positions at which the ordinary pixels 51 are arranged are, for example, color filters corresponding to light of wavelength bands of colors such as red color (R), green color (G), and blue color (B), as the same with the color filters of a Bayer array. At this time, it is preferable that the color filter CF attached to a position at which the motion detection pixel 52 is arranged is, for example, a color filter corresponding to light of a wavelength band of white (W). Accordingly, the motion detection pixel 52 can detect a motion of an object without depending on light of a specific wavelength band. However, in the present invention, the colors and the arrangement of the color filters CF attached to the solid-state imaging device 1 are not particularly limited.

For example, by using a color filter transmitting light of near infrared wavelength band as the color filter CF attached to the position at which the motion detection pixel 52 is attached, the motion detection pixel 52 may be configured to be capable of detecting the motion of an object even by using light of the near infrared wavelength band. The method of causing light of the near infrared wavelength band to be incident to the motion detection pixel 52 is not limited to a method using the characteristics of the color filter CF, but, for example, may be a method using a configuration in which an infrared cutoff filter eliminating light of the near infrared wavelength band is not arranged only at the position of the motion detection pixel 52.

In this way, in the solid-state imaging device 1, by arranging each ordinary pixel 51 specialized for the output of a pixel signal through ordinary imaging and each motion detection pixel 52 specialized for the output of an event pixel signal through motion detection inside the pixel array unit 40, both purposes of motion detection for sequentially detecting the motion of an object and ordinary imaging can be realized together. At this time, in the solid-state imaging device 1, pixel signals acquired through ordinary imaging using the ordinary pixels 51 are sequentially read in units of frames through ordinary reading. In the solid-state imaging device 1, when the motion of an object is detected through motion detection, event pixel signals are sequentially output using motion detection reading at asynchronous timing regardless of ordinary reading for reading pixel signals in units of frames in ordinary imaging. Accordingly, in the solid-state imaging device 1, ordinary reading and motion detection reading can be simultaneously performed.

In the solid-state imaging device 1, as in the first arrangement example described above, the number of the ordinary pixels 51 arranged inside the pixel array unit 40 is configured to be larger than that of the motion detection pixels 52. In other words, in the solid-state imaging device 1, by forming the motion detection pixels 52 arranged inside the pixel array unit 40 to be divided into the first semiconductor substrate 11 and the second semiconductor substrate 12, the number of the ordinary pixels 51 arranged inside the pixel array unit 40 can be increased. Accordingly, in the solid-state imaging device 1, the degradation in the image quality of an image generated in the ordinary imaging can be suppressed. When an image processing unit generates an image on the basis of pixel signals in ordinary imaging, wherein the image processing unit is configured to generate the image on the basis of the pixel signals in ordinary imaging that are output from the solid-state imaging device 1, the image processing unit generates the image including the pixel signals of all the pixels by interpolating pixel signals of positions at which the motion detection pixels 52 are arranged in the solid-state imaging device 1. In other words, the image processing unit generates the image including the pixel signals of all the pixels by interpolating pixel signals of missing pixels.

More specifically, in a case where an image is generated based on pixel signals read from ordinary pixels 51 through ordinary reading, the image processing unit interpolates pixel signals of ordinary pixels 51 corresponding to the positions at which the motion detection pixels 52 are arranged based on the pixel signals of the peripheral ordinary pixels 51 thereof. In the present invention, the method (the method of performing an interpolation operation of pixels) of interpolating pixel signals of ordinary pixels 51 corresponding to positions at which the motion detection pixels 52 are arranged is not particularly limited.

In the solid-state imaging device 1, as described above, the motion detection pixels 52 arranged inside the pixel array unit 40 are formed to be divided into the first semiconductor substrate 11 and the second semiconductor substrate 12. Accordingly, the solid-state imaging device 1 can form the motion detection pixels without decreasing the area of the photoelectric conversion devices PD2 included in each motion detection pixel 52. Accordingly, in the solid-state imaging device 1, the photoelectric conversion device PD2 included in the motion detection pixel 52 can generate a larger electric charge signal corresponding to the motion of the object. In this way, the solid-state imaging device 1 can suppress degradation of accuracy of motion detection.

In the first arrangement example of the ordinary pixels 51 and the motion detection pixels 52 described above, the number of the motion detection pixels 52 arranged inside the pixel array unit 40 is smaller than the number of the ordinary pixels 51. However, in the detection of the motion of an object, high resolution, in other words, high image quality as required for an image generated in ordinary imaging is not required. Rather, in the motion detection for sequentially detecting the motion of an object, it is preferable that the photoelectric conversion device PD2 of the motion detection pixel 52 generates more electric charge signals in a short time such that degradation of the accuracy of motion detection is suppressed. In other words, it is preferable that, by enlarging the area of the photoelectric conversion device PD2, the speed of the motion detection can be improved.

On the other hand, in the ordinary imaging, it is preferable to realize high resolution by increasing the number of ordinary pixels 51 included in the pixel array unit 40. In the solid-state imaging device 1 according to the first embodiment, by furtherly increasing the number of ordinary pixels 51 arranged inside the pixel array unit 40, the image quality of an image generated in ordinary imaging can be improved, in other words, a configuration of acquiring high-definition output can be formed.

Second Arrangement Example

Figure 6:
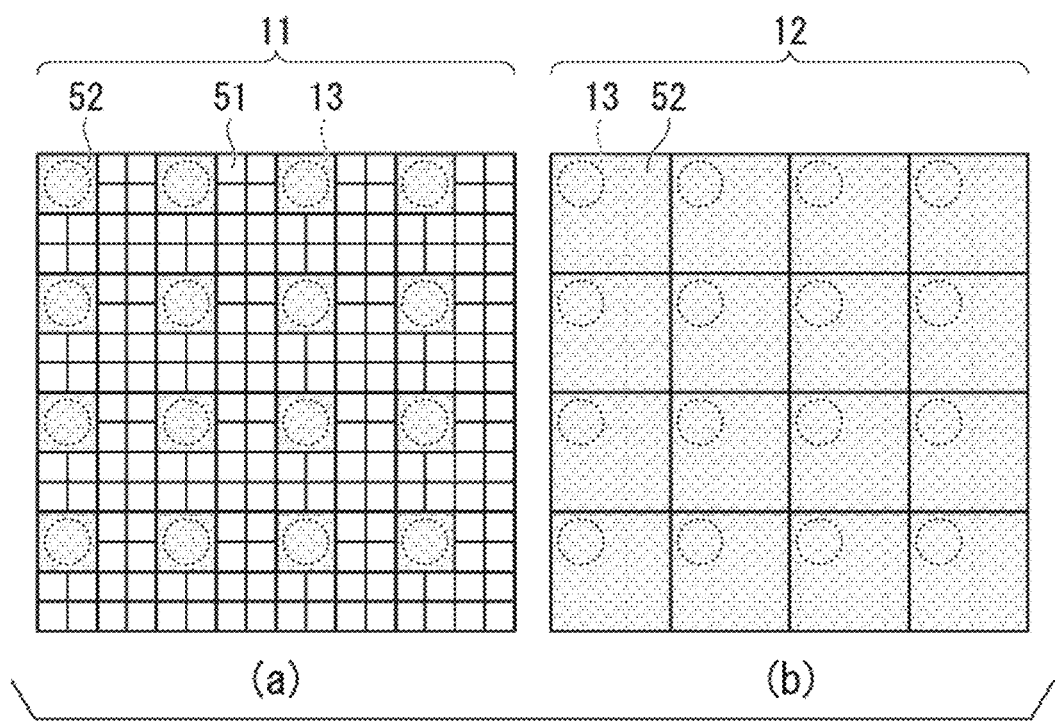
FIG. 6 is a diagram schematically showing another example of the arrangement of pixels in the solid-state imaging device according to the first embodiment of the present invention.

Another example of the arrangement of ordinary pixels 51 and motion detection pixels 52 inside the pixel array unit 40 of the solid-state imaging device 1 according to the first embodiment will be described. FIG. 6 is a diagram schematically showing another example (second arrangement example) of the arrangement of pixels 50 (ordinary pixels 51 and motion detection pixels 52) of the solid-state imaging device 1 according to the first embodiment of the present invention. FIG. 6, similar to the first arrangement example of the ordinary pixels 51 and the motion detection pixels 52 shown in FIG. 4, shows an example of the arrangement of ordinary pixels 51 and motion detection pixels 52 disposed inside the pixel array unit 40 formed in semiconductor substrates configuring the solid-state imaging device 1.

In the second arrangement example of ordinary pixels 51 and motion detection pixels 52 of the solid-state imaging device 1 shown in FIG. 6, similar to the first arrangement example of the ordinary pixels 51 and the motion detection pixels 52 shown in FIG. 4, the ordinary pixels 51 and the motion detection pixels 52 are arranged in a planar shape (periodically in the row direction and the column direction). Also in the second arrangement examples of the ordinary pixels 51 and the motion detection pixels 52 shown in FIG. 6, similar to the first arrangement example of the ordinary pixels 51 and the motion detection pixel 52 shown in FIG. 4, the ordinary pixels 51 are formed in the first semiconductor substrate 11, and the motion detection pixels 52 are formed to be divided into the first semiconductor substrate 11 and the second semiconductor substrate 12. A part (a) of FIG. 6 shows an example in which the ordinary pixels 51 of high definition and the motion detection pixels 52 are arranged inside the area of a pixel array unit 40 of the first semiconductor substrate 11 configuring the solid-state imaging device 1. A part (b) of FIG. 6 shows an example in which motion detection pixels 52 are arranged inside the area of a pixel array unit 40 of the second semiconductor substrate 12 configuring the solid-state imaging device 1.

By implementing high definition of the ordinary pixels 51, as shown in the part (a) of FIG. 6, an area that is necessary for arranging one ordinary pixel 51 is decreased, and more ordinary pixels 51 can be arranged in the planar area of the pixel array unit 40 of the first semiconductor substrate 11.

An area required for the arrangement of the motion detection pixel 52 has the same size as that of the motion detection pixel 52 in the arrangement of the ordinary pixels 51 and the motion detection pixel 52 shown in FIG. 4. Accordingly, as shown in the part (a) of FIG. 6 and the part (b) of FIG. 6, the motion detection pixel 52 is formed using an area in which more ordinary pixels 51 are arranged.

More specifically, in the first arrangement example of the ordinary pixels 51 and the motion detection pixels 52 shown in FIG. 4, in the first semiconductor substrate 11, a photoelectric conversion device PD2 and an output circuit of each motion detection pixel 52 are formed (see the part (a) of FIG. 4) by using a planar area having the same size as that of the ordinary pixel 51, and, in the second semiconductor substrate 12, a reading circuit of each motion detection pixel 52 is formed (see the part (b) of FIG. 4) by using a planar area having a size corresponding to four ordinary pixels 51.

In contrast to the above-mentioned example, in the second arrangement example of the ordinary pixels 51 and the motion detection pixels 52 shown in FIG. 6, as shown in the part (a) of FIG. 6, in the pixel array unit 40 of the first semiconductor substrate 11, the photoelectric conversion device PD2 and the output circuit of the motion detection pixel 52 is formed using a planar area of a size corresponding to four ordinary pixels 51. In the second arrangement example of the ordinary pixels 51 and the motion detection pixels 52 shown in FIG. 6, as shown in the part (b) of FIG. 6, in the pixel array unit 40 of the second semiconductor substrate 12, the reading circuit of each motion detection pixel 52 is formed using a planar area of a size corresponding to 16 ordinary pixels 51. Then, similar to the first arrangement example of the ordinary pixels 51 and the motion detection pixels 52 shown in FIG. 4, the output circuit formed in the first semiconductor substrate 11 and the reading circuit formed in the second semiconductor substrate 12 are electrically connected using the chip connecting part 13 (see the part (a) of FIG. 6 and the part (b) of FIG. 6).

Figure 7:
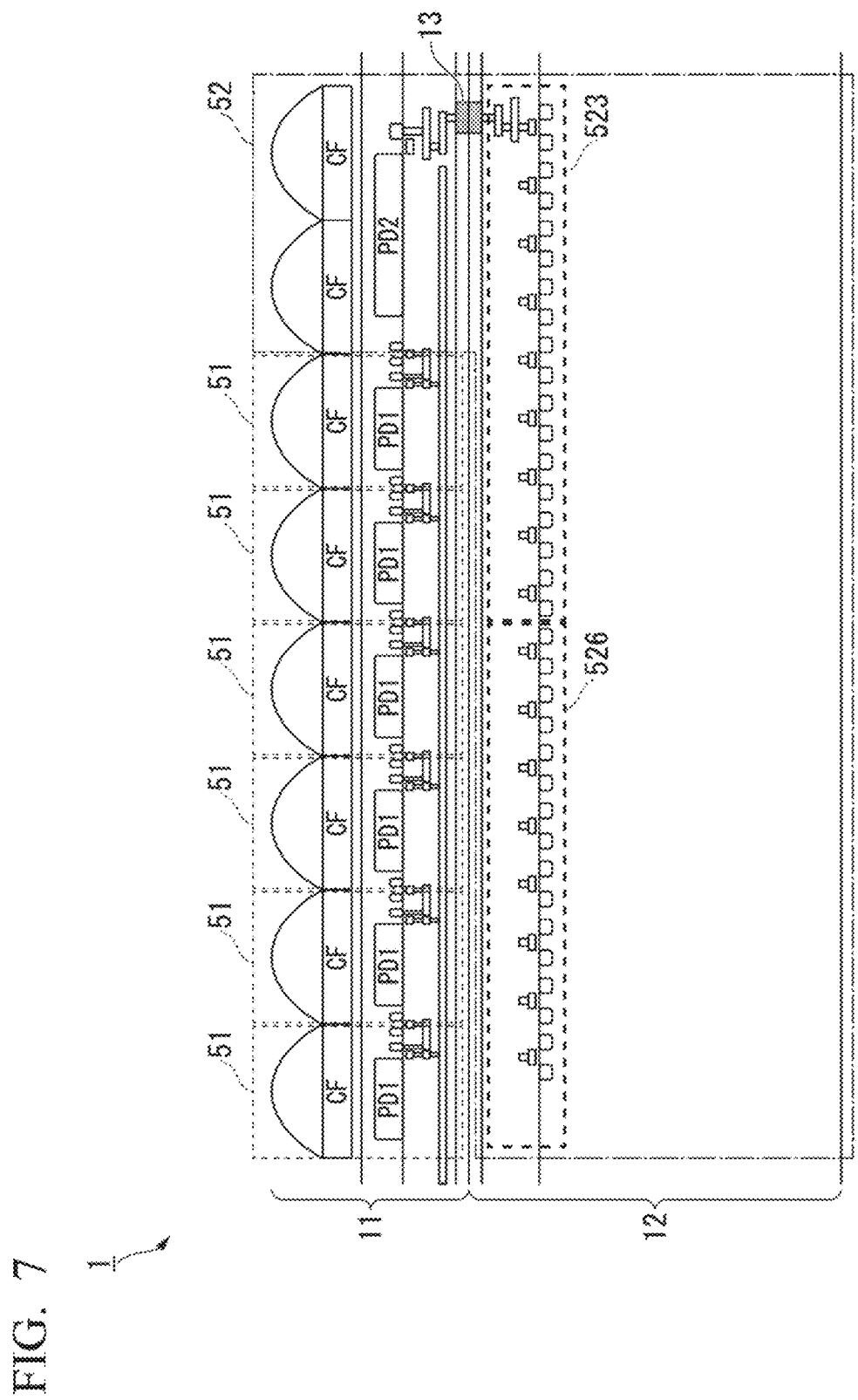
FIG. 7 is a cross-sectional view showing an example of another structure of the solid-state imaging device according to the first embodiment of the present invention.

The structure of the solid-state imaging device 1 according to the first embodiment of the second arrangement example shown in FIG. 6 will be described. FIG. 7 is a cross-sectional view showing an example of another structure of the solid-state imaging device 1 according to the first embodiment of the present invention. FIG. 7, similar to the example of the vertical structure of the solid-state imaging device 1 shown in FIG. 5, shows the vertical structure of a part of the pixel array unit 40 of a case where ordinary pixels 51 and motion detection pixels 52 are arranged as in the second arrangement example in the solid-state imaging device 1. More specifically, the vertical structure of six ordinary pixels 51 formed in the first semiconductor substrate 11 and one motion detection pixel 52 formed in the first semiconductor substrate 11 and the second semiconductor substrate 12 is shown.

As described above, in the second arrangement example of the solid-state imaging device 1 shown in FIG. 6, ordinary pixels 51 of high definition are arranged in the first semiconductor substrate 11. Accordingly, as shown in FIG. 7, the area of the photoelectric conversion device PD1 of the ordinary pixel 51 formed in the first semiconductor substrate 11 is smaller than the area of the photoelectric conversion device PD2 of the motion detection pixel 52. Also in the second arrangement example of the solid-state imaging device 1 shown in FIG. 6, the reading circuit of the motion detection pixel 52 is formed in an area of the second semiconductor substrate 12 including an area overlapping the area of the ordinary pixel 51 formed in the first semiconductor substrate 11. FIG. 7, similar to the example of the vertical structure of the solid-state imaging device 1 shown in FIG. 5, shows a state in which a switched capacitor amplifier circuit 523 and an AER circuit 526 included in the reading circuit of the motion detection pixel 52 formed inside the second semiconductor substrate 12 are formed. In FIG. 7, similar to the example of the vertical structure of the solid-state imaging device 1 shown in FIG. 5, a state is shown in which an output circuit of the motion detection pixel 52 and a corresponding reading circuit of the motion detection pixel 52 are electrically connected using the chip connecting part 13 formed between the first semiconductor substrate 11 and the second semiconductor substrate 12.

The vertical structure of the solid-state imaging device 1 shown in FIG. 7 shows the configuration of the solid-state imaging device 1 in which a micro lens having the same size as that of the ordinary pixel 51 is formed on the side to which light of the motion detection pixel 52 is incident. In other words, the configuration of the solid-state imaging device 1 in which light is incident from two micro lenses to the photoelectric conversion device PD2 of the motion detection pixel 52 is shown in FIG. 7. However, in the present invention, the shape of the micro lens formed on the side to which light of the motion detection pixel 52 arranged in the solid-state imaging device 1 is incident is not particularly limited. Thus, a configuration may be employed in which, on the side of the motion detection pixel 52 to which light is incident, a micro lens having a size different from a micro lens corresponding to each ordinary pixel 51, in other words, a micro lens having a size corresponding to the motion detection pixel 52 is formed.

Also in the vertical structure of the solid-state imaging device 1 shown in FIG. 7, while the configuration of the solid-state imaging device 1 in which color filters CF are attached to the side of the ordinary pixels 51 and the motion detection pixel 52 to which light is incident is shown, as described above, in the present invention, the colors and the arrangement of the color filters CF attached to the solid-state imaging device 1 are not particularly limited. For example, as shown in the part (b) of FIG. 4, in a case where the reading circuit of each motion detection pixel 52 is formed using a planar area having a size corresponding to four ordinary pixels 51, the color filter CF attached to the position at which the motion detection pixel 52 is arranged may be not only a color filter corresponding to light of the wavelength band of white (W) described above but also color filters corresponding to light of wavelength bands of red color (R), two green colors (G), and blue color (B). The color filter CF attached to a position at which each motion detection pixel 52 is arranged may be color filters corresponding to light of the wavelength bands of red color (R), green color (G), blue color (B), and white color (W). Furthermore, the color filter CF attached to a position at which each motion detection pixel 52 is arranged may be color filters corresponding to light of the wavelength bands of red color (R), green color (G), blue color (B), and near infrared (Ir).

In the second arrangement example of the solid-state imaging device 1, by arranging each ordinary pixel 51 of high definition and each motion detection pixel 52 inside the pixel array unit 40, both of motion detection for sequentially detecting the motion of an object and ordinary imaging can be realized together, and an image generated through the ordinary imaging is configured to have high resolution to improve the image quality.

According to the first embodiment, a solid-state imaging device (the solid-state imaging device 1) is configured to include a first semiconductor substrate (the first semiconductor substrate 11) to which light is incident; a second semiconductor substrate (the second semiconductor substrate 12) that is stacked on an opposite surface with respect to a surface on which the light is incident to the first semiconductor substrate 11; n first photoelectric conversion devices (the photoelectric conversion devices PD1) that are periodically arranged in the first semiconductor substrate 11 and the n first photoelectric conversion devices generate first electric charge signals acquired by performing photoelectric conversions of the incident light; n first reading circuits (the reading circuit of the ordinary pixel 51 including the charge transfer transistor 511, the pixel reset transistor 512, the amplification transistor 513, the selection transistor 514, and the node capacitance FD1) respectively arranged in correspondence with the n first photoelectric conversion devices PD1 in the first semiconductor substrate 11, each of the n first reading circuits accumulating the first electric charge signal generated by a corresponding one of the photoelectric conversion devices PD1, and each of the n first reading circuits outputting a signal voltage corresponding to the accumulated first electric charge signal as a first pixel signal (a pixel signal output by the ordinary pixel 51); a driving circuit (the vertical scanning circuit 20 and the horizontal scanning circuit 30) that outputs the first pixel signal by sequentially driving each of reading circuits of the n ordinary pixels 51; m second photoelectric conversion devices (the photoelectric conversion devices PD2) that are periodically arranged in one of the first semiconductor substrate 11 and the second semiconductor substrate 12 and generate second electric charge signals acquired by performing photoelectric conversions of incident light; and m second reading circuits (the reading circuits of the motion detection pixels 52) that sequentially output a second pixel signal (event pixel signal) indicating a change in the second electric charge signal generated by a corresponding one photoelectric conversion device PD2 among the m photoelectric conversion devices PD2, wherein each of the reading circuits of the m motion detection pixels 52 includes: a detection circuit (the threshold amplifier 524 and the threshold amplifier 525) that detects a temporal change of the second electric charge signal generated by the corresponding one of the photoelectric conversion devices PD2 and the detection circuit outputs an event signal indicating a direction of the change when the change exceeding a predetermined threshold is detected; and a pixel signal generating circuit (the AER circuit 526) that is arranged in the second semiconductor substrate 12 and outputs the event pixel signal in which address information indicating a position at which the corresponding one of the photoelectric conversion devices PD2 is arranged is added to the event signal, n is a natural number equal to 2 or more than 2, and m is a natural number equal to 2 or more than 2.

According to the first embodiment, a solid-state imaging device 1 is configured in which each of the m motion detection pixels 52 further includes an amplification circuit (the switched capacitor amplifier circuit 523) that is arranged in the second semiconductor substrate 12 and amplifies the second electric charge signal generated by the corresponding one of the photoelectric conversion devices PD2, and the threshold amplifier 524 and the threshold amplifier 525 detect a change in the second electric charge signal after being amplified by the switched capacitor amplifier circuit 523.

According to the first embodiment, a solid-state imaging device 1 is configured in which m is smaller than n, and an area in which each of the m photoelectric conversion devices PD2 receives light is larger than an area in which each of the n photoelectric conversion devices PD1 receives light.

According to the first embodiment, a solid-state imaging device 1 is configured in which a connection part (the chip connecting part 13) that is formed between the first semiconductor substrate 11 and the second semiconductor substrate 12 and electrically connects a circuit element of the first semiconductor substrate 11 and a circuit element of the second semiconductor substrate 12 is further included, m is smaller than n, each of the m photoelectric conversion devices PD2 is arranged in the first semiconductor substrate 11, and the chip connecting part 13 electrically connects the threshold amplifier 524 and the threshold amplifier 525 included in each of the reading circuits of the m motion detection pixels 52 and corresponding one photoelectric conversion device PD2.

As described above, in the solid-state imaging device 1 according to the first embodiment, each ordinary pixel 51 specialized for the output of a pixel signal through ordinary imaging and each motion detection pixel 52 specialized for the output of an event pixel signal through motion detection are arranged in the pixel array unit 40 periodically (in a planar shape) in the row direction and the column direction. At this time, in the solid-state imaging device 1 according to the first embodiment, the ordinary pixels 51 are formed in the first semiconductor substrate 11, and the motion detection pixels 52 are formed to be divided into the first semiconductor substrate 11 and the second semiconductor substrate 12. More specifically, the photoelectric conversion device PD2 and the output circuit of the motion detection pixel 52 are formed in the first semiconductor substrate 11, and the reading circuit is formed to include an area overlapping the area of the ordinary pixel 51 formed in the first semiconductor substrate 11 in the second semiconductor substrate 12. Accordingly, in the solid-state imaging device 1 according to the first embodiment, the number of the ordinary pixels 51 arranged inside the pixel array unit 40 can be configured to be more than the number of the motion detection pixels 52, and the image quality of an image generated in the ordinary imaging can be improved. In the solid-state imaging device 1 according to the first embodiment, the photoelectric conversion device PD2 of each motion detection pixel 52 arranged inside the pixel array unit 40 can be configured to be large such that a larger electric charge signal corresponding to the motion of an object is generated and the degradation of accuracy of motion detection can be suppressed.

In the solid-state imaging device 1 according to the first embodiment, by forming the ordinary pixels 51 specialized for the output of pixel signals acquired through the ordinary imaging and the motion detection pixels 52 specialized for the output of event pixel signals acquired through the motion detection, the ordinary imaging and the motion detection for sequentially detecting the motions of an object can be performed together. Then, in the solid-state imaging device 1 according to the first embodiment, reading of pixel signals of the ordinary imaging from the ordinary pixels 51 in units of frames through ordinary reading and reading of pixel signals of the motion detection from the motion detect ion pixels 52 at asynchronous timing through the motion detection reading can be simultaneously performed.

Second Embodiment

Next, a second embodiment of the present invention will be described. The outline and the schematic configuration of a solid-state imaging device (hereinafter, referred to as a "solid-state imaging device 2") according to the second embodiment of the present invention are similar to those of the solid-state imaging device 1 according to the first embodiment shown in FIGS. 1 and 2. Thus, in the description below, the same reference numeral will be used for a component element similar to the component element of the solid-state imaging device 1 according to the first embodiment among the component elements of the solid-state imaging device 2, and a detailed description of each of the component elements and the operation thereof will be omitted.

Figure 8A:
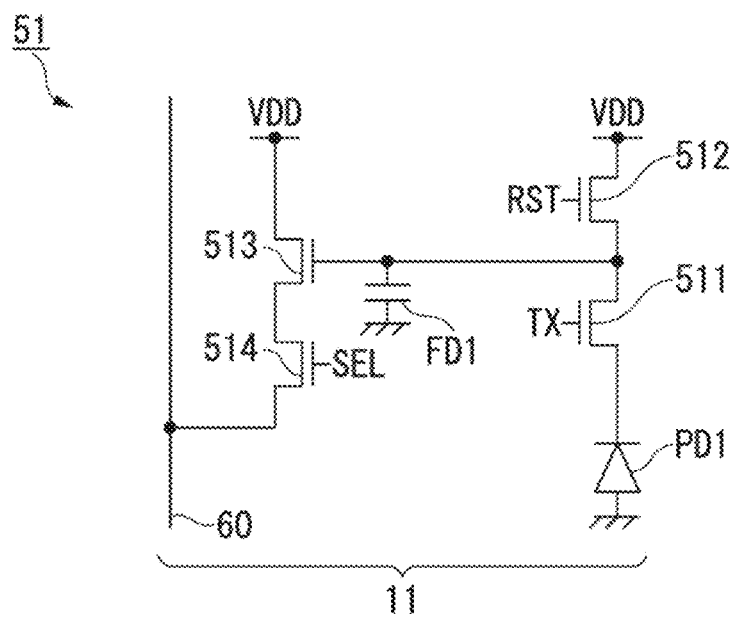
FIG. 8A is a circuit diagram showing an example of the configuration of a pixel in a solid-state imaging device according to a second embodiment of the present invention.
Figure 8B:
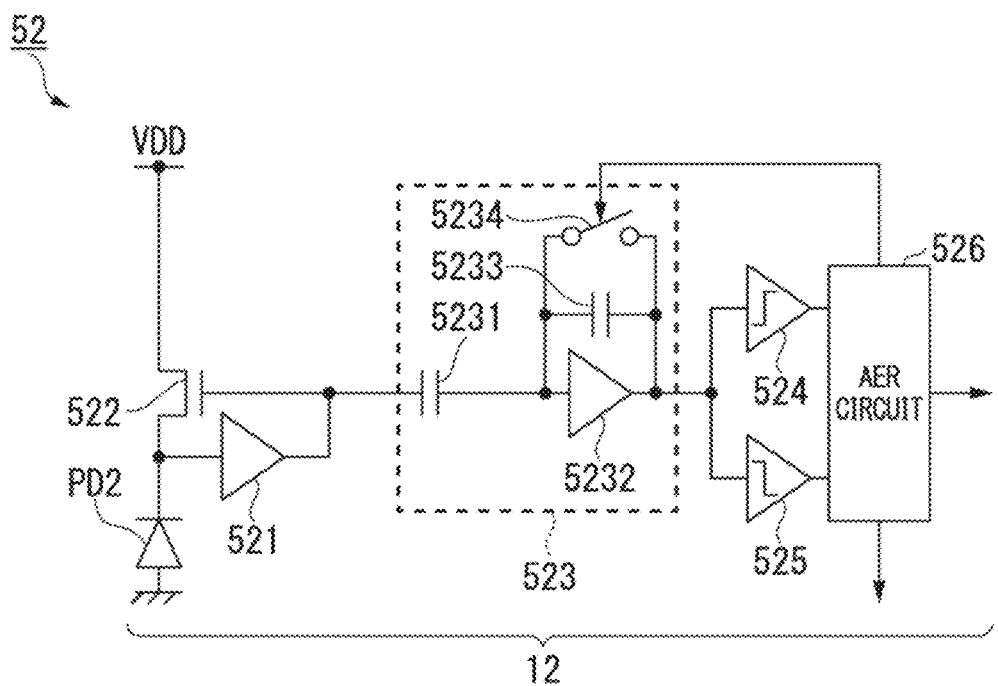
FIG. 8B is a circuit diagram showing an example of the configuration of a pixel in the solid-state imaging device according to the second embodiment of the present invention.

The configuration of ordinary pixels 51 and motion detection pixels 52 arranged inside a pixel array unit 40 of the solid-state imaging device 2 according to the second embodiment will be described. In the solid-state imaging device 2, the ordinary pixels 51 are formed in a first semiconductor substrate 11, and the motion detection pixels 52 are formed in a second semiconductor substrate 12. FIGS. 8A and 8B are circuit diagrams showing examples of the pixels 50 (the ordinary pixel 51 and the motion detection pixel 52) of the solid-state imaging device 2 according to the second embodiment of the present invention. FIG. 8A shows an example of the configuration of the ordinary pixel 51 arranged inside the pixel array unit 40 of the solid-state imaging device 2, and FIG. 8B shows an example of the configuration of the motion detection pixel 52 arranged inside the pixel array unit 40 of the solid-state imaging device 2.

The configuration of the ordinary pixel 51, as shown in FIG. 8A, is a configuration similar to that of the ordinary pixel 51 of the solid-state imaging device 1 according to the first embodiment shown in FIG. 3A. Thus, a detailed description of the configuration and the operation of the ordinary pixel 51 will be omitted.

The configuration of the motion detection pixel 52, as shown in FIG. 8B, is a configuration similar to that of the motion detection pixel 52 of the solid-state imaging device 1 according to the first embodiment shown in FIG. 3B.

However, in the solid-state imaging device 2, as described above, the motion detection pixel 52 is formed in the second semiconductor substrate 12. In other words, in the solid-state imaging device 2, different with the configuration of the solid-state imaging device 1 according to the first embodiment, the motion detection pixels 52 are not formed to be divided into the first semiconductor substrate 11 and the second semiconductor substrate 12 but formed only in the second semiconductor substrate 12. Accordingly, a chip connecting part 13 is not included in the motion detection pixel 52 of the solid-state imaging device 2. The other circuit elements included in the motion detection pixel 52 are similar to those of the motion detection pixel 52 of the solid-state imaging device 1 according to the first embodiment shown in FIG. 3B. Thus, a detailed description of the configuration and the operation of the motion detection pixel 52 will be omitted.

Third Arrangement Example

Figure 9:
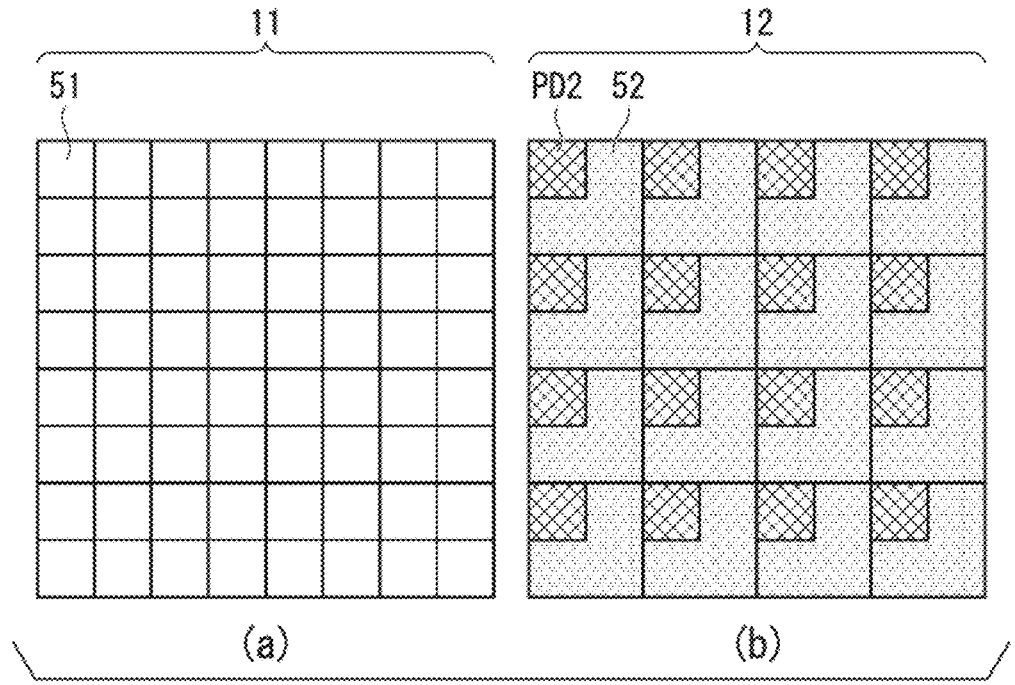
FIG. 9 is a diagram schematically showing an example of the arrangement of pixels in the solid-state imaging device according to the second embodiment of the present invention.

Next, an example of the arrangement of ordinary pixels 51 and motion detection pixels 52 inside the pixel array unit 40 of the solid-state imaging device 2 according to the second embodiment will be described. FIG. 9 is a diagram schematically showing an example (third arrangement example) of the arrangement of pixels 50 (ordinary pixels 51 and motion detection pixels 52) of the solid-state imaging device 2 according to the second embodiment of the present invention. In FIG. 9, similar to the first arrangement example of the pixels 50 of the solid-state imaging device 1 according to the first embodiment shown in FIG. 4, an example of the arrangement of ordinary pixels 51 and motion detection pixels 52 inside the pixel array unit 40 formed in each semiconductor substrate configuring the solid-state imaging device 2 is shown.

Also in the solid-state imaging device 2, similar to the configuration of the solid-state imaging device 1 according to the first embodiment, ordinary pixels 51 and motion detection pixels 52 are arranged in a planar shape. However, as described above, in the solid-state imaging device 2, the ordinary pixels 51 are formed in the first semiconductor substrate 11, and the motion detection pixels 52 are formed in the second semiconductor substrate 12. That is, in the solid-state imaging device 2, the motion detection pixels 52 are arranged to be stacked on a surface disposed on the side opposite to a surface of the side on which light is incident to the ordinary pixels 51. In other words, in the solid-state imaging device 2, the motion detection pixels 52 are arranged on the rear side of the ordinary pixels 51. Then, in the solid-state imaging device 2, light (rays) passing through the ordinary pixel 51 is incident to the motion detection pixel 52. A part (a) of FIG. 9 shows an example in which the ordinary pixels 51 are arranged inside the area of the pixel array unit 40 of the first semiconductor substrate 11 configuring the solid-state imaging device 2. A part (b) of FIG. 9 shows an example in which the motion detection pixels 52 are arranged inside the area of the pixel array unit 40 of the second semiconductor substrate 12 configuring the solid-state imaging device 2.

More specifically, as shown in the part (a) of FIG. 9, the ordinary pixels 51 are arranged in the planar area of the pixel array unit 40 of the first semiconductor substrate 11 in the row direction and the column direction. As shown in the part (b) of FIG. 9, in the planar area of the pixel array unit 40 of the second semiconductor substrate 12, the motion detection pixels 52 are arranged in the planar area of the pixel array unit 40 of the second semiconductor substrate 12 in the row direction and the column direction. At this time, in the planar area of the pixel array unit 40 of the second semiconductor substrate 12, as shown in the part (b) of FIG. 9, the photoelectric conversion devices PD2 of the motion detection pixels 52 are arranged to periodically overlap the ordinary pixels 51 arranged in the planar area of the pixel array unit 40 of the first semiconductor substrate 11 in the row direction and the column direction. Then, the output circuit and the reading circuit of the motion detection pixel 52 are formed to include an area of a plurality of ordinary pixels 51 in which the photoelectric conversion device PD2 of the motion detection pixel 52 is not arranged in an overlapping manner. That is, in the solid-state imaging device 2, the motion detection pixel 52 is formed using an area of the second semiconductor substrate 12 overlapping an area of a plurality of ordinary pixels 51 formed in the first semiconductor substrate 11, wherein the motion detection pixel 52 is configured by more circuit elements than those of the ordinary pixel 51 such that it requires a large area at the time of formation of the motion detection pixel 52.

In the part (b) of FIG. 9, in the solid-state imaging device 1 according to the first embodiment, the photoelectric conversion devices PD2 of the motion detection pixels 52 are periodically arranged in a planar area of the pixel array unit 40 of the second semiconductor substrate 12 corresponding to positions at which the photoelectric conversion devices PD2 and the output circuits of the motion detection pixels 52 are arranged in the first semiconductor substrate 11. In the area of the second semiconductor substrate 12 in which the photoelectric conversion devices PD2 are arranged, similar to the solid-state imaging device 1 according to the first embodiment, the output circuit of the motion detection pixel 52 may be additionally formed.

The photoelectric conversion device PD2 of each motion detection pixel 52 arranged in the second semiconductor substrate 12 generates an electric charge signal acquired by performing a photoelectric conversion of light (rays) transmitting through the area of the photoelectric conversion device PD1 of the ordinary pixel 51 arranged in the first semiconductor substrate 11. Accordingly, in the solid-state imaging device 2, each motion detection pixel 52 arranged in the second semiconductor substrate 12 outputs an event pixel signal according to detection of the motion of an object, at a position similar to that of the motion detection pixel 52 arranged in the first semiconductor substrate 11 of the solid-state imaging device 1 according to the first embodiment.

In this way, in the solid-state imaging device 2, by arranging the ordinary pixels 51 specialized for the output of pixel signals though ordinary imaging inside the pixel array unit 40 of the first semiconductor substrate 11 and arranging the motion detection pixels 52 specialized for the output of event pixel signals through motion detection inside the pixel array unit 40 of the second semiconductor substrate 12, similar to the solid-state imaging device 1 according to the first embodiment, both of the motion detection for sequentially detecting the motion of an object and the ordinary imaging can be realized together. Then, also in the solid-state imaging device 2, similar to the solid-state imaging device 1 according to the first embodiment, both of the ordinary reading and the motion detection reading can be simultaneously performed. In this way, also in the solid-state imaging device 2, effects similar to those of the solid-state imaging device 1 according to the first embodiment can be acquired. In other words, also in the solid-state imaging device 2, degradation of the image quality of an image generated in ordinary imaging can be suppressed, and degradation of the accuracy of motion detection can be suppressed.

Furthermore, as the same with the third arrangement example described above, in the solid-state imaging device 2, the ordinary pixels 51 are arranged in the first semiconductor substrate 11, and the motion detection pixels 52 are arranged in the second semiconductor substrate 12 such that ordinary pixel 51 that cannot output a pixel signal during the ordinary imaging does not exist in the solid-state imaging device 2, in other words, there is no pixel signal of a missing pixel. Accordingly, the image processing unit generating an image on the basis of pixel signals output from the solid-state imaging device 2 in ordinary imaging does not need to perform an interpolation of pixel signals of missing pixels when an image on the basis of the pixel signals is generated.

Also in the solid-state imaging device 2, similar to the solid-state imaging device 1 according to the first embodiment, by furtherly increasing the number of ordinary pixels 51 arranged inside the pixel array unit 40, the image quality of an image generated in the ordinary imaging can be improved, in other words, a configuration for realizing an increase in the number of pixels can be employed.

Fourth Arrangement Example

Figure 10:
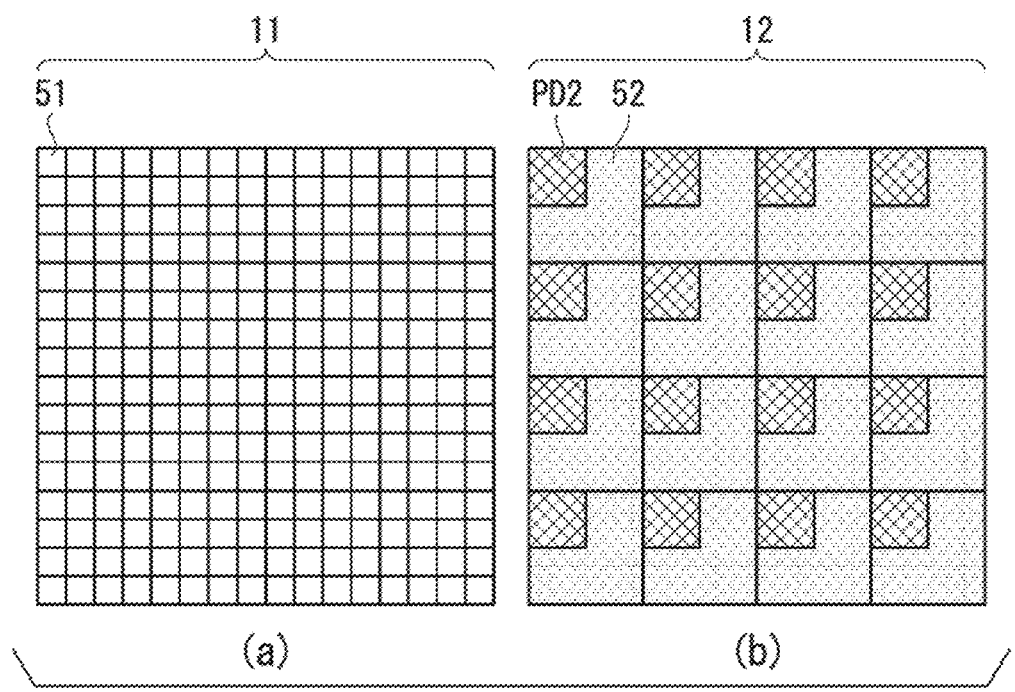
FIG. 10 is a diagram schematically showing another example of the arrangement of pixels in the solid-state imaging device according to the second embodiment of the present invention.

An example of the configuration in which the image quality of an image generated in ordinary imaging by the solid-state imaging device 2 according to the second embodiment will be described. FIG. 10 is a diagram schematically showing another example (fourth arrangement example) of the arrangement of pixels 50 (ordinary pixels 51 and motion detection pixels 52) of the solid-state imaging device 2 according to the second embodiment of the present invention. In FIG. 10, similar to the third arrangement example of the ordinary pixels 51 and the motion detection pixels 52 shown in FIG. 9, an example of the arrangement of ordinary pixels 51 and motion detection pixels 52 inside the pixel array unit 40 formed in each semiconductor substrate configuring the solid-state imaging device 2 is shown.

Also in the fourth arrangement example of the ordinary pixels 51 and the motion detection pixels 52 of the solid-state imaging device 2 shown in FIG. 10, similar to the third arrangement example of the ordinary pixels 51 and the motion detection pixels 52 shown in FIG. 9, the ordinary pixels 51 are formed in the first semiconductor substrate 11, and the motion detection pixels 52 are formed in the second semiconductor substrate 12. Then, the first semiconductor substrate 11 in which the ordinary pixels 51 are formed and the second semiconductor substrate 12 in which the motion detection pixels 52 are formed are stacked with each other. A part (a) of FIG. 10 shows an example in which the ordinary pixels 51 of high definition are arranged in the row direction and the column direction inside the area of the pixel array unit 40 of the first semiconductor substrate 11 configuring the solid-state imaging device 2. A part (b) of FIG. 10 shows an example in which the motion detection pixels 52 are arranged in the row direction and the column direction inside the area of the pixel array unit 40 of the second semiconductor substrate 12 configuring the solid-state imaging device 2.

By implementing high definition of the ordinary pixels 51, also in the solid-state imaging device 2, as shown in the part (a) of FIG. 10, an area that is necessary for arranging one ordinary pixel 51 is decreased, and more ordinary pixels 51 can be arranged in the planar area of the pixel array unit 40 of the first semiconductor substrate 11.

An area required for the arrangement of the motion detection pixel 52 in the second semiconductor substrate 12 has the same size as the area required for the arrangement of the motion detection pixel 52 shown in the part (b) of FIG. 9. Accordingly, as shown in the part (a) of FIG. 10 and the part (b) of FIG. 10, the motion detection pixel 52 is formed using an area in which more ordinary pixels 51 are arranged.

More specifically, in the third arrangement example of the ordinary pixels 51 and the motion detection pixels 52 shown in FIG. 9, one motion detection pixel 52 is formed in an area of the second semiconductor substrate 12 having the same size as that of the area of four ordinary pixels 51 formed in the first semiconductor substrate 11. In contrast to such a configuration, in the fourth arrangement example of the ordinary pixels 51 and the motion detection pixels 52 shown in FIG. 10, one motion detection pixel 52 is formed in an area of the second semiconductor substrate 12 having the same size as the area of 16 ordinary pixels 51 formed in the first semiconductor substrate 11.

In the fourth arrangement example of the ordinary pixels 51 and the motion detection pixels 52 shown in FIG. 10, the photoelectric conversion device PD2 of each motion detection pixel 52 arranged in the second semiconductor substrate 12 generates an electric charge signal acquired by performing a photoelectric conversion of light (rays) transmitting through the area of the photoelectric conversion devices PD1 of four ordinary pixels 51 arranged in the first semiconductor substrate 11. Accordingly, as in the fourth arrangement example shown in FIG. 10, in the solid-state imaging device 2 in which the ordinary pixels 51 and the motion detection pixels 52 are arranged, each motion detection pixel 52 arranged in the second semiconductor substrate 12, similar to the second arrangement example of the ordinary pixels 51 and the motion detection pixels 52 of the solid-state imaging device 1 according to the first embodiment, outputs an event pixel signal acquired according to the detection of the motion of an object at a position similar to that of the motion detection pixel 52 arranged in the first semiconductor substrate 11.

In this way, also in the fourth arrangement example of the solid-state imaging device 2, similar to the second arrangement example of the solid-state imaging device 1 according to the first embodiment, by implementing high definition of the ordinary pixels 51 arranged inside the pixel array unit 40 of the first semiconductor substrate 11, it is possible to improve the image quality by implementing high resolution of an image generated in ordinary imaging.

Figure 11:
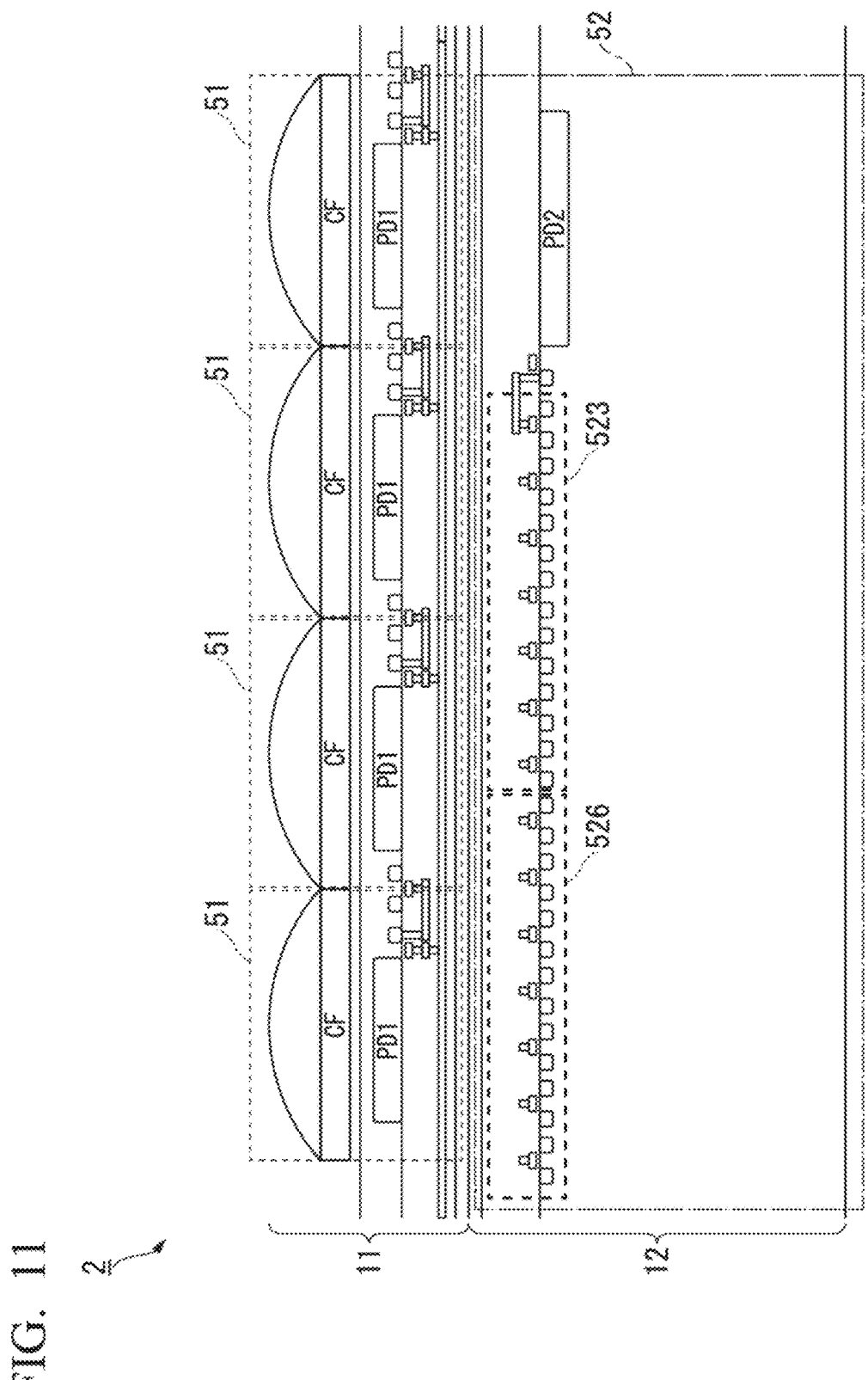
FIG. 11 is a cross-sectional view showing an example of the structure of the solid-state imaging device according to the second embodiment of the present invention.

The structure of the solid-state imaging device 2 according to the second embodiment will be described. FIG. 11 is a cross-sectional view showing an example of the structure of the solid-state imaging device 2 according to the second embodiment of the present invention. FIG. 11 shows the vertical structure of a part of the pixel array unit 40 of a case where ordinary pixels 51 and motion detection pixels 52 are arranged as in the third arrangement example in the solid-state imaging device 2. More specifically, FIG. 11 shows the vertical structure of the third arrangement example of the ordinary pixels 51 and the motion detection pixels 52 shown in FIG. 9, wherein FIG. 9 shows a configuration that four ordinary pixels 51 are formed in the first semiconductor substrate 11 and one motion detection pixel 52 is formed in the second semiconductor substrate 12. The structure of the solid-state imaging device 2 of the fourth arrangement example shown in FIG. 10 is different from the third arrangement example shown in FIG. 11 only in the number of pixels and may be similarly considered.

As described above, in the third arrangement example of the solid-state imaging device 2 shown in FIG. 9, the ordinary pixels 51 are arranged in the first semiconductor substrate 11, and the motion detection pixels are formed in areas of the second semiconductor substrate 12 overlapping the areas of the ordinary pixels 51. More specifically, in the second semiconductor substrate 12 stacked on a surface disposed on the side (the rear side of the ordinary pixels 51) opposite to a surface disposed on the side (the front side of the ordinary pixels 51) on which light is incident to the ordinary pixels 51, the motion detection pixels 52 are formed by including areas overlapping the areas of the ordinary pixels 51 formed in the first semiconductor substrate 11. FIG. 11 shows a state in which a photoelectric conversion device PD2 of each motion detection pixel 52 formed inside the second semiconductor substrate 12, and a switched capacitor amplifier circuit 523 and an AER circuit 526 included in the reading circuit of each motion detection pixel 52 are formed. In the solid-state imaging device 2, since the first semiconductor substrate 11 and the second semiconductor substrate 12 are not electrically connected, a chip connecting part 13 is not formed.

As described above, in the solid-state imaging device 2, the photoelectric conversion device PD2 of each motion detection pixel 52 arranged in the second semiconductor substrate 12 generates an electric charge signal acquired by performing a photoelectric conversion of light (rays) transmitting through the area of the photoelectric conversion device PD1 of the ordinary pixel 51 arranged in the first semiconductor substrate 11. Accordingly, as light has a longer wavelength transmitted more through the first semiconductor substrate 11, the photoelectric conversion device PD2 generates a larger electric charge signal.

The vertical structure of the solid-state imaging device 2 shown in FIG. 11 shows the configuration of the solid-state imaging device 2 in which color filters CF are attached to the sides of the ordinary pixel 51 to which light is incident. In other words, the configuration of the solid-state imaging device 2 outputting a pixel signal used for the generation of a color image in ordinary imaging is shown. Accordingly, light passing through the color filter CF attached to the ordinary pixel 51 arranged in the first semiconductor substrate 11 stacked on the side to which light is incident and the ordinary pixel 51 is incident to the photoelectric conversion device PD2 of the motion detection pixel 52.

In the present invention, the colors and the arrangement of the color filters CF attached to the solid-state imaging device 2 are not particularly limited. However, as described above, in the solid-state imaging device 2, as light has a longer wavelength, the photoelectric conversion device PD2 formed in the second semiconductor substrate 12 generates a larger electric charge signal. Accordingly, in the solid-state imaging device 2, it is preferable to form the photoelectric conversion device PD2 formed in the second semiconductor substrate 12 at a position corresponding to the ordinary pixel 51 to which a color filter CF corresponding to light of a wavelength band of red color (R) that is transmitted through the ordinary pixel 51 more due to a long wavelength is attached. In such a case, for example, a configuration may be employed in which a light source emitting infrared light is included in an imaging system having the solid-state imaging device 2 mounted thereon, and the accuracy of the motion detection is improved by emitting infrared light at the time of detecting the motion of an object.

Also in the solid-state imaging device 2, similar to the solid-state imaging device 1 according to the first embodiment, it is preferable to detect the motion of an object not by using light of a specific wavelength band. Accordingly, it is preferable that light transmitted through the first semiconductor substrate 11 and incident to the photoelectric conversion device PD2 formed in the second semiconductor substrate 12 shown in FIG. 11 is not light of a specific wavelength band. For example, in a case where several color filters CF corresponding to light of wavelength bands of red color (R), green color (G), blue color (B), and white color (W) are attached to the ordinary pixels 51 arranged in the first semiconductor substrate 11 of the solid-state imaging device 2, the photoelectric conversion device PD2 formed in the second semiconductor substrate 12 may be formed at a position corresponding to the ordinary pixel 51 to which the color filter CF corresponding to light of the wavelength band of white color (W) is attached. The photoelectric conversion device PD2 formed in the second semiconductor substrate 12, for example, may be formed at a position corresponding to the ordinary pixel 51 to which the color filter CF corresponding to light of the wavelength band of green color (G) is attached. In such a case, the motion detection pixel 52 can detect the motion of an object by using light of the wavelength band of green color (G) that can be regarded to represent the luminance of an image generated in ordinary imaging.

However, for example, in the case of a configuration in which an infrared cutoff filter is not arranged for detecting the motion of an object by using light of the near infrared wavelength band, the colors of the color filters CF attached to the ordinary pixels 51 have no relevance to the detection of the motion. For example, as shown in the part (b) of FIG. 10, in a case where the photoelectric conversion device PD2 of the motion detection pixel 52 is formed using a planar area having a size of a plurality of (four in the part (b) of FIG. 10) ordinary pixels 51, by forming the photoelectric conversion device at a position including all the colors attached to the ordinary pixels 51, the colors of the color filters CF attached to the ordinary pixels 51 have no relevance to the detection of the motion.

The vertical structure of the solid-state imaging device 2 shown in FIG. 11 represents a configuration of the solid-state imaging device 2 in which a micro lens is formed on the side of each ordinary pixel 51 to which light is incident. Accordingly, as shown in the part (b) of FIG. 10, in a case where the photoelectric conversion device PD2 of the motion detection pixel 52 is formed using a planar area corresponding to four ordinary pixels 51, light incident from each of four micro lenses is transmitted through the ordinary pixel 51 corresponding to the micro lens and is incident to the photoelectric conversion device PD2 of the motion detection pixel 52. For example, light transmitted through the ordinary pixels 51 corresponding to light of the wavelength bands of red color (R), green color (G), blue color (B), and white color (W) is incident to the photoelectric conversion device PD2 of the motion detection pixel 52.

According to the second embodiment, a solid-state imaging device (solid-state imaging device 2) is configured that each of m second photoelectric conversion devices (photoelectric conversion devices PD2) is arranged in the second semiconductor substrate (second semiconductor substrate 12), wherein each of the m second photoelectric conversion devices generates a second electric charge signal by performing a photoelectric conversion of light transmitted through corresponding p photoelectric conversion devices PD1 among n first photoelectric conversion devices (photoelectric conversion devices PD1), and wherein p is a natural number equal to 1 or more than 1.

As described above, also in the solid-state imaging device 2 according to the second embodiment, similar to the solid-state imaging device 1 according to the first embodiment, ordinary pixels 51 specialized for the output of pixel signals acquired through ordinary imaging and motion detection pixels 52 specialized for the output of event pixel signals acquired through motion detection are periodically (in a planar shape) arranged in the pixel array unit 40 in the row direction and the column direction. At this time, in the solid-state imaging device 2 according to the second embodiment, the ordinary pixels 51 are formed in the first semiconductor substrate 11, and the motion detection pixels 52 are formed in the second semiconductor substrate 12. In other words, in the solid-state imaging device 2 according to the second embodiment, the motion detection pixels 52 are arranged on a surface disposed on the side (the rear side of the ordinary pixels 51) opposite to a surface disposed on the side (the rear side of the ordinary pixels 51) on which light is incident to the ordinary pixels 51. Accordingly, also in the solid-state imaging device 2 according to the second embodiment, similar to the solid-state imaging device 1 according to the first embodiment, the number of the ordinary pixels 51 arranged inside the pixel array unit 40 can be configured to be more than the number of the motion detection pixels 52, and the image quality of an image generated in ordinary imaging can be improved. Also in the solid-state imaging device 2 according to the second embodiment, similar to the solid-state imaging device 1 according to the first embodiment, the photoelectric conversion device PD2 of each motion detection pixel 52 arranged inside the pixel array unit 40 can be configured to be large, and a larger electric charge signal corresponding to the motion of an object is generated such that the degradation of the accuracy of motion detection can be suppressed.

Also in the solid-state imaging device 2 according to the second embodiment, similar to the solid-state imaging device 1 according to the first embodiment, by forming the ordinary pixels 51 specialized for the output of pixel signals acquired through the ordinary imaging and the motion detection pixels 52 specialized for the output of event pixel signals acquired through the motion detection, both of the ordinary imaging and the motion detection for sequentially detecting the motions of an object can be realized together. Also in the solid-state imaging device 2 according to the second embodiment, similar to the solid-state imaging device 1 according to the first embodiment, reading of pixel signals of the ordinary imaging from the ordinary pixels 51 in units of frames through ordinary reading and reading of pixel signals of the motion detection from the motion detection pixels 52 at asynchronous timing through the motion detection reading can be simultaneously performed.

Third Embodiment

Next, a third embodiment of the present invention will be described. The outline and the schematic configuration of a solid-state imaging device (hereinafter, referred to as a "solid-state imaging device 3") according to the third embodiment of the present invention are similar to those of the solid-state imaging device 1 according to the first embodiment shown in FIGS. 1 and 2. Thus, in the description below, the same reference numeral will be used for a component element similar to the component element of the solid-state imaging device 1 according to the first embodiment among the component elements of the solid-state imaging device 3, and a detailed description of each of the component elements and the operation thereof will be omitted.

First Configuration Example

The configuration of pixels 50 arranged inside a pixel array unit 40 of the solid-state imaging device 3 according to the third embodiment will be described. Similar to the solid-state imaging device 1 according to the first embodiment and the solid-state imaging device 2 according to the second embodiment, the pixels 50 arranged inside the pixel array unit 40 of the solid-state imaging device 3 outputs pixel signals of ordinary imaging acquired through ordinary reading and event pixel signals of motion detection acquired through motion detection reading as well. However, each pixel 50 arranged inside the pixel array unit 40 of the solid-state imaging device 3 acquires a pixel signal of the ordinary imaging and an event pixel signal from an electric charge signal generated by the same photoelectric conversion device. In other words, the photoelectric conversion device included in each pixel 50 arranged inside the pixel array unit 40 of the solid-state imaging device 3 is served as both a photoelectric conversion device PD1 included in an ordinary pixel 51 arranged inside the pixel array unit 40 of the solid-state imaging device 1 according to the first embodiment or the solid-state imaging device 2 according to the second embodiment and a photoelectric conversion device PD2 included in a motion detection pixel 52. In the description below, a pixel 50, which is arranged inside the pixel array unit 40 of the solid-state imaging device 3, performing the output of a pixel signal of ordinary imaging acquired through ordinary reading and the output of an event pixel signal of motion detection acquired through motion detection reading will be referred to as a "double-use pixel 53".

Figure 12:
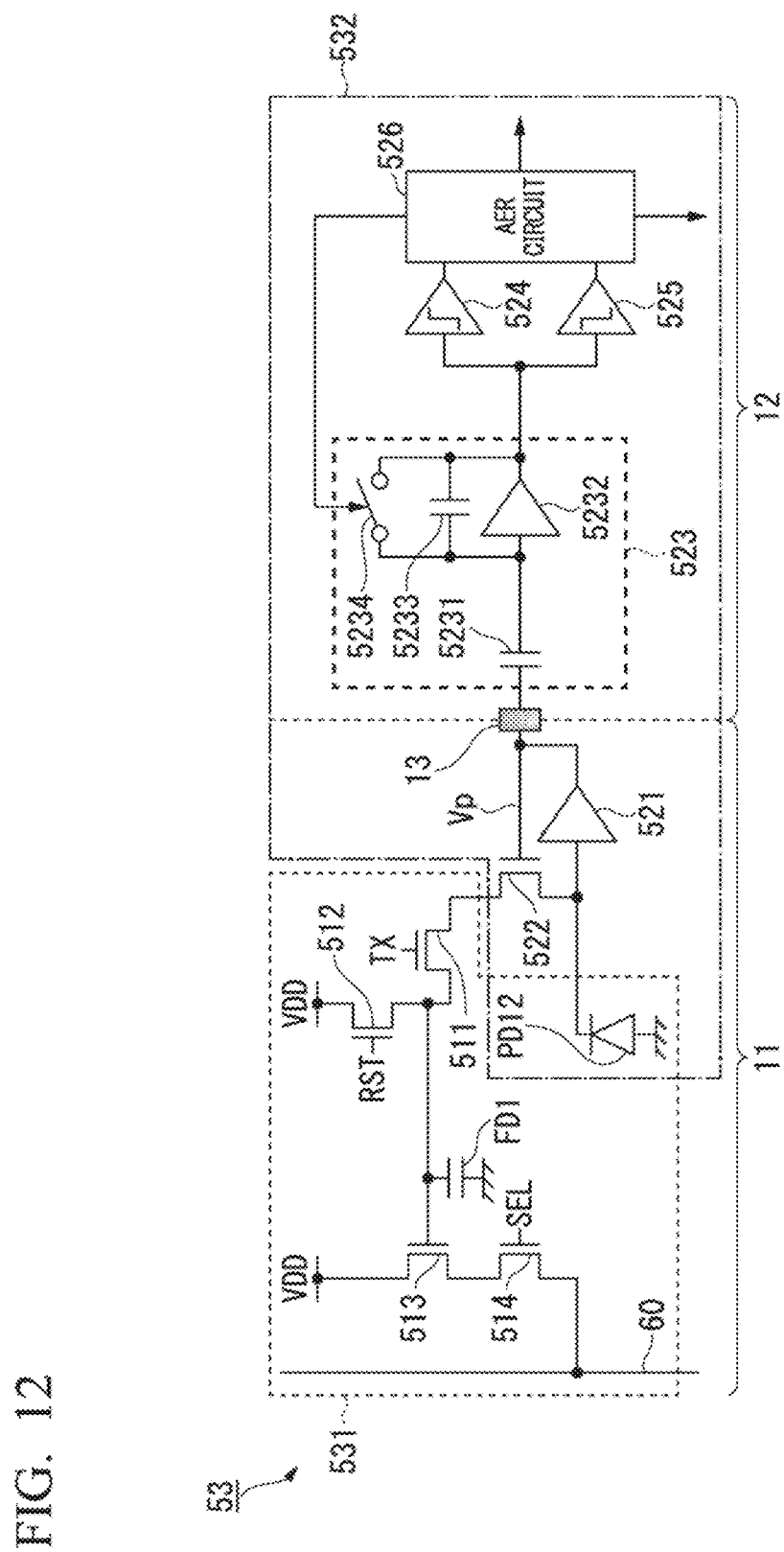
FIG. 12 is a circuit diagram showing an example of the configuration of a pixel in a solid-state imaging device according to a third embodiment of the present invention.

FIG. 12 is a circuit diagram showing an example (first configuration example) of the configuration of the double-use pixel 53 of the solid-state imaging device 3 according to the third embodiment of the present invention. The circuit elements configuring the double-use pixel 53 include circuit elements similar to the circuit elements of the ordinary pixel 51 or the motion detection pixel 52 arranged in the solid-state imaging device 1 according to the first embodiment or the solid-state imaging device 2 according to the second embodiment. Thus, in the description below, the same reference will be assigned to a circuit element similar to the circuit element configuring the ordinary pixel 51 or the motion detection pixel 52 among the circuit elements of the double-use pixel 53, and a detailed description thereof will be omitted.

As shown in FIG. 12, the double-use pixel 53 includes a photoelectric conversion device PD12; a charge transfer transistor 511; a pixel reset transistor 512; an amplification transistor 513; a selection transistor 514; an amplifier 521; a bias transistor 522; a switched capacitor amplifier circuit 523; a threshold amplifier 524; a threshold amplifier 525; and an AER circuit 526. The switched capacitor amplifier circuit 523 includes a capacitor 5231, an amplifier 5232, a capacitor 5233, and a switch 5234. In FIG. 12, node capacitance FD1 that is capacitance accompanying a node connected to the gate terminal of the amplification transistor 513 included in the double-use pixel 53 is denoted using a symbol of a capacitor as a circuit element of the double-use pixel 53.

The double-use pixel 53 is configured by using the photoelectric conversion device PD12, the charge transfer transistor 511, the pixel reset transistor 512, the amplification transistor 513, the selection transistor 514, and the node capacitance FD1 such that the double-use pixel 53 configures a pixel generating an electric charge signal through ordinary imaging, in other words, the double-use pixel 53 configures a pixel similar to the ordinary pixel 51 of the solid-state imaging device 1 according to the first embodiment or the solid-state imaging device 2 according to the second embodiment. In the description below, the double-use pixel 53 generating an electric charge signal through ordinary imaging will be referred to as an "ordinary double-use pixel 531". In the ordinary double-use pixel 531, a reading circuit is configured by the node capacitance FD1 and a group of the charge transfer transistor 511, the pixel reset transistor 512, the amplification transistor 513, and the selection transistor 514, wherein the reading circuit reads a pixel signal corresponding to an electric charge signal generated by the photoelectric conversion device PD12 in ordinary imaging.

The double-use pixel 53 is configured by using the configuration of the photoelectric conversion device PD12, the amplifier 521, the bias transistor 522, the switched capacitor amplifier circuit 523, the threshold amplifier 524, the threshold amplifier 525, and the AER circuit 526 such that the double-use pixel 53 configures a pixel generating an electric charge signal used for motion detection, in other words, the double-use pixel 53 configures a pixel similar to the motion detection pixel 52 of the solid-state imaging device 1 according to the first embodiment or the solid-state imaging device 2 according to the second embodiment. In the description below, the double-use pixel 53 generating an electric charge signal used for motion detection will be referred to as a "motion detection double-use pixel 532". In the motion detection double-use pixel 532, an output circuit outputting an electric charge signal generated by the photoelectric conversion device PD12 for motion detection is configured by the amplifier 521 and the bias transistor 522, and a reading circuit reading an electric charge signal generated by the photoelectric conversion device PD12 for motion detection is configured by the switched capacitor amplifier circuit 523, the threshold amplifier 524, the threshold amplifier 525, and the AER circuit 526.

In the solid-state imaging device 3, the double-use pixels 53 are uniformly arranged in the whole planar area of the pixel array unit 40. At this time, in the solid-state imaging device 3, the photoelectric conversion devices PD12, the reading circuits of the ordinary double-use pixels 531, and the output circuits of the motion detection double-use pixels 532 are formed in a first semiconductor substrate 11. In the solid-state imaging device 3, the reading circuits of the motion detection double-use pixels 532 are formed in the second semiconductor substrate 12.

The photoelectric conversion device PD12, similar to the photoelectric conversion device PD1 included in the ordinary pixel 51 and the photoelectric conversion device PD2 included in the motion detection pixel 52 in the solid-state imaging device 1 according to the first embodiment or the solid-state imaging device 2 according to the second embodiment, is a photodiode generating an electric charge signal by performing a photoelectric conversion of incident light (rays) and storing the generated electric charge signal. The photoelectric conversion device PD12 sequentially outputs the generated electric charge signals to the amplifier 521.

In a case where the double-use pixel 53 is operated as a pixel outputting a pixel signal through the ordinary imaging, in other words, in a case where a pixel signal is output to a vertical signal line 60 from the ordinary double-use pixel 531 through the ordinary reading, the amplifier 521 outputs a voltage signal Vp having a voltage to the gate terminal of the bias transistor 522 in accordance with the control of the bias, the voltage signal Vp causing the bias transistor 522 to be constantly in the On state. In other words, in a case where the double-use pixel 53 outputs a pixel signal acquired through the ordinary imaging, an electric charge signal generated by the photoelectric conversion device PD12 is directly transmitted to the charge transfer transistor 511 by the bias transistor 522. Accordingly, the charge transfer transistor 511 transmits an electric charge signal to the gate terminal of the amplification transistor 513 in accordance with a control signal TX input from a vertical scanning circuit 20, wherein the electric charge signal is generated and stored by the photoelectric conversion device PD12 and the electric charge signal is input via the bias transistor 522. Accordingly, an electric charge signal transmitted to the charge transfer transistor 511 is accumulated in the node capacitance FD1.

In accordance with such operations, the double-use pixel 53 (the ordinary double-use pixel 531) reads a signal voltage according to an electric charge signal acquired by the photoelectric conversion device PD12 performing a photoelectric conversion of incident light into the vertical signal line 60 as a pixel signal.

On the other hand, in a case where the double-use pixel 53 is operated as a pixel generating an electric charge signal for motion detection, in other words, in a case where an event pixel signal of motion detection is output from the motion detection double-use pixel 532 through the motion detection reading, the vertical scanning circuit 20 performs control of a control signal RST such that the pixel reset transistor 512 is constantly in the On state. The vertical scanning circuit 20 controls the control signal TX to be a fixed bias voltage. In this way, a fixed voltage corresponding to the fixed bias voltage is supplied to the bias transistor 522 by the pixel reset transistor 512 and the charge transfer transistor 511.

According to the above-described operations, in the double-use pixel 53 (the motion detection double-use pixel 532), the photoelectric conversion device PD12 generates an electric charge signal of magnitude corresponding to the motion of an object and the photoelectric conversion device PD12 outputs an event pixel signal corresponding to a change in the electric charge signal and the direction of the change.

As described above, the double-use pixel 53 is served as the ordinary double-use pixel 531, the motion detection double-use pixel 532, and the photoelectric conversion device PD12. Accordingly, in the solid-state imaging device 3, reading of a pixel signal of ordinary imaging from the ordinary double-use pixel 531 in units of frames through ordinary reading and reading of a pixel signal of motion detection from the motion detection double-use pixel 532 at asynchronous timing through motion detection reading are performed exclusively.

Figure 13:
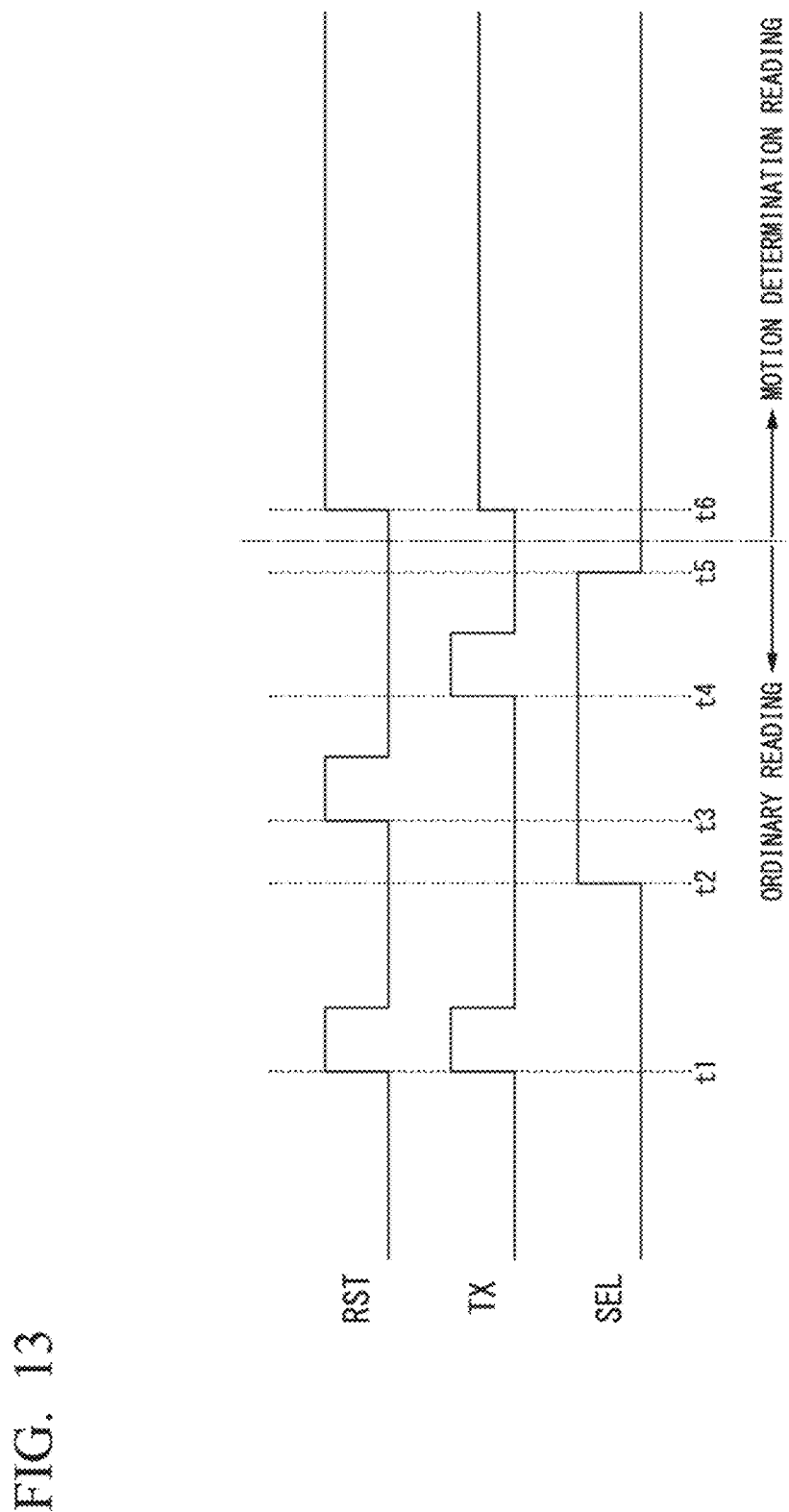
FIG. 13 is a timing diagram showing an example of timing at which a pixel is driven in the solid-state imaging device according to the third embodiment of the present invention.

The driving timing of the double-use pixel 53 of the solid-state imaging device 3 according to the third embodiment will be described. FIG. 13 is a timing diagram showing an example of timing at which the double-use pixel 53 is driven in the solid-state imaging device 3 according to the third embodiment of the present invention. The timing diagram shown in FIG. 13 shows control timing of the vertical scanning circuit 20 for controlling the double-use pixel 53 of the first configuration example such that, after outputting a pixel signal acquired through ordinary imaging to the vertical signal line 60, exposure for motion detection is performed.

In a case where ordinary imaging is performed, firstly, at time t1, all the double-use pixels 53 disposed inside the pixel array unit 40 are reset. More specifically, at time t1, the vertical scanning circuit 20 simultaneously sets a control signal RST and a control signal TX to a "High" level to cause the pixel reset transistor 512 and the charge transfer transistor 511 to be in the On state. Accordingly, the photoelectric conversion devices PD12 and the node capacitance FD1 included in all the double-use pixels 53 disposed inside the pixel array unit 40 are reset.

Thereafter, the vertical scanning circuit 20 simultaneously sets the control signal RST and the control signal TX to a "Low" level to cause the pixel reset transistor 512 and the charge transfer transistor 511 to be in the Off state and the vertical scanning circuit 20 releases the resetting of all the double-use pixels 53 disposed inside the pixel array unit 40. Accordingly, all the double-use pixels 53 disposed inside the pixel array unit 40 simultaneously start exposure. In other words, the photoelectric conversion devices PD12 included in all the double-use pixels 53 disposed inside the pixel array unit 40 start to generate and store electric charge signals acquired by performing photoelectric conversions of incident light.

Subsequently, after a predetermined period elapses, in other words, after an arbitrary exposure time elapses in ordinary imaging, from time t2, ordinary reading of a pixel signal from each double-use pixel 53 disposed inside the pixel array unit 40 is performed.

More specifically, during ordinary reading, at time t2, the vertical scanning circuit 20 sets a control signal SEL to the "High" level to cause the selection transistor 514 to be in the On state and the vertical scanning circuit 20 sets the amplification transistor 513 to be in the state being connected to the vertical signal line 60. Accordingly, a state is formed in which a signal voltage output from the amplification transistor 513 is output to the vertical signal line 60 through the selection transistor 514.

Subsequently, at time t3, the vertical scanning circuit 20 sets the control signal RST to the "high" level to cause the pixel reset transistor 512 to be in the On state and the vertical scanning circuit 20 resets the node capacitance FD1. Accordingly, the signal voltage of the reset level of the photoelectric conversion device PD12 is output from the amplification transistor 513 to the vertical signal line 60 by the selection transistor 514. Thereafter, the vertical scanning circuit 20 sets the control signal RST to the "Low" level to cause the pixel reset transistor 512 to be in the Off state and releases the resetting of the node capacitance FD1.

Subsequently, at time t4, the vertical scanning circuit 20 sets the control signal TX to the "High" level to cause the charge transfer transistor 511 to be in the On state and the vertical scanning circuit 20 transmits an electric charge signal stored in the photoelectric conversion device PD12 to the gate terminal of the amplification transistor 513. At this time, the electric charge signal transmitted by the charge transfer transistor 511 is accumulated in the node capacitance FD1. Accordingly, a signal voltage corresponding to the electric charge signal generated by the photoelectric conversion device PD12, in other words, the electric charge signal accumulated in the node capacitance FD1 is output from the amplification transistor 513 to the vertical signal line 60 via the selection transistor 514.

In an imaging system in which the solid-state imaging device 3 is mounted, a difference between the signal voltage of the reset level output at time t3 and the signal voltage corresponding to the electric charge signal generated by the photoelectric conversion device PD12 output at time t4 may be taken for performing a noise eliminating process for the pixel signal.

Thereafter, the vertical scanning circuit 20 sets the control signal to the "Low" level to cause the charge transfer transistor 511 to be in the Off state, the vertical scanning circuit 20 stops the transmission of an electric charge signal stored in the photoelectric conversion device PD12 to the gate terminal of the amplification transistor 513. Subsequently, at time t5, the vertical scanning circuit 20 sets the control signal SEL to the "Low" level to cause the selection transistor 514 to be in the Off state and the vertical scanning circuit 20 sets the amplification transistor 513 to be in the state of being disconnected from the vertical signal line 60.

According to such control, a pixel signal corresponding to electric charge signals generated by the photoelectric conversion devices PD12 included in all the double-use pixels 53 disposed inside the pixel array unit 40 is read through ordinary reading.

While the control timing of the vertical scanning circuit 20 for one double-use pixel 53 is shown in FIG. 13, in ordinary reading, the vertical scanning circuit 20 performs similar control for all the double-use pixels 53 arranged inside the pixel array unit 40 of the solid-state imaging device 3 such that reading of pixel signals of ordinary imaging from the double-use pixels 53 is performed in units of frames. More specifically, as the vertical scanning circuit 20 sequentially performs control of ordinary reading of time t2 to time t5 for each row of the double-use pixels 53 disposed inside the pixel array unit 40, whereby a pixel signal of each row is sequentially output to the vertical signal line 60. Thereafter, the horizontal scanning circuit 30 outputs the pixel signal of each row output to the vertical signal line 60 of each column for each column, whereby all the pixel signals of one frame are output to the outside of the solid-state imaging device 3.

When ordinary reading of pixel signals of one frame ends in the ordinary imaging, from time t6, motion detection using each double-use pixel 53 disposed inside the pixel array unit 40, in other words, motion detection reading can be performed.

More specifically, in motion detection reading, at time t6, the vertical scanning circuit 20 sets the control signal RST to the "high" level to cause the pixel reset transistor 512 in the On state. Also, the vertical scanning circuit 20 sets the control signal TX to a fixed bias voltage. Accordingly, a fixed voltage corresponding to the fixed bias voltage is supplied to the bias transistor 522 from the charge transfer transistor 511. Then, the double-use pixel 53 sequentially outputs event pixel signals on the basis of pulse signals corresponding to the electric charge signals generated by the photoelectric conversion device PD12.

In a case where ordinary imaging is performed at the time of the state in which motion detection reading is performed, the vertical scanning circuit 20 firstly sets the state to the state before time t1 and then the vertical scanning circuit 20 performs control of the ordinary reading of time t1 to time t5. More specifically, the vertical scanning circuit 20 sets each of the control signal RST and the control signal TX to the "Low" level to cause each of the pixel reset transistor 512 and the charge transfer transistor 511 to be in the Off state once and then the vertical scanning circuit 20 performs the control of time t1 to time t5 described above.

According to such driving timing, each double-use pixel 53 arranged inside the pixel array unit 40 of the solid-state imaging device 3 exclusively performs reading of a pixel signal of ordinary imaging in units of frames through the ordinary reading and reading of a pixel signal of motion detection at asynchronous timing through the motion detection reading.

In this way, in the solid-state imaging device 3, by uniformly arranging the double-use pixels 53 performing the output of a pixel signal acquired through ordinary imaging and the output of an event pixel signal acquired through motion detection inside the pixel array unit 40, similar to the solid-state imaging device 1 according to the first embodiment and the solid-state imaging device 2 according to the second embodiment, both of the motion detection sequentially detecting the motion of an object and the ordinary imaging can be realized together.

In the solid-state imaging device 3, as described above, the double-use pixels 53 are uniformly arranged in the whole planar area of the pixel array unit 40. Accordingly, in the solid-state imaging device 3, the output circuits and the reading circuits of the motion detection double-use pixels 532 configured inside the double-use pixels 53 are formed to be divided into the first semiconductor substrate 11 and the second semiconductor substrate 12. Accordingly, a range in which the ordinary double-use pixels 531 configured inside the double-use pixels 53 can be formed to be high definition, in other words, a range to which the number of the ordinary double-use pixels 531 arranged inside the pixel array unit 40 can be increased up is dependent on an area required for the formation of reading circuits of the motion detection double-use pixels 532 can be secured. However, as described above, in the solid-state imaging device 3, it is preferable that the image quality of an image generated in the ordinary imaging is improved by arranging more ordinary double-use pixels 531, while the degradation of accuracy of motion detection is suppressed by detecting the motion of an object on the basis of a larger electric charge signal by the motion detection double-use pixel 532.

Accordingly, also in the solid-state imaging device 3, it may be considered to arrange the double-use pixels 53 on the basis of consideration (see FIGS. 4 to 7) similar to that of the first arrangement example or the second arrangement example of the pixels 50 in the solid-state imaging device 1 according to the first embodiment. More specifically, in the solid-state imaging device 1 according to the first embodiment, the double-use pixels 53 may be considered to be arranged instead of the motion detection pixels 52 arranged in the pixel array unit 40. However, in the solid-state imaging device 3, even the configuration of the double-use pixels 53 is changed, improving the image quality of an image generated in ordinary imaging, in other words, realizing high resolution, while suppressing the degradation of accuracy of motion detection can be achieved.

Second Configuration Example

Next, in the solid-state imaging device 3 according to the third embodiment, an example (second configuration example) of another configuration of the pixels 50 arranged inside the pixel array unit 40 will be described. The pixel 50 (hereinafter, referred to as a "double-use pixel 54") of the second configuration example is a pixel having a configuration such that the image quality of an image generated in ordinary imaging is improved by implementing high definition of the ordinary double-use pixel 531 generating an electric charge signal through ordinary imaging, while the degradation of accuracy of motion detection is suppressed by increasing the number of photoelectric conversion devices PD12 served also by the motion detection double-use pixel 532 generating an electric charge signal used for motion detection.

Figure 14:
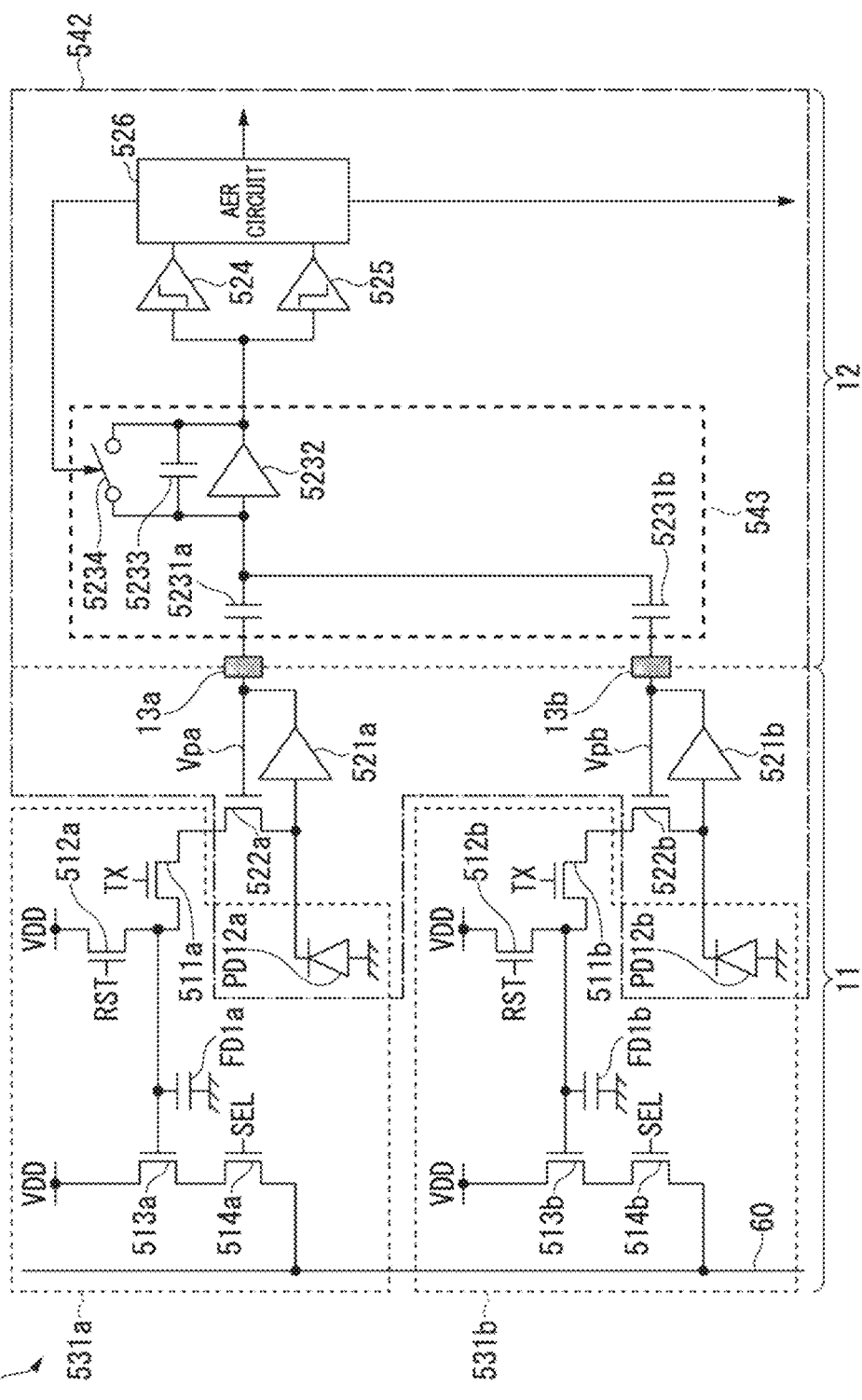
FIG. 14 is a circuit diagram showing another example of the configuration of pixels of the solid-state imaging device according to the third embodiment of the present invention.

FIG. 14 is a circuit diagram showing another example (second configuration example) of the configuration of the pixels 50 of the solid-state imaging device 3 according to the third embodiment of the present invention. FIG. 14 shows a double-use pixel 54 configured to include two high-definition ordinary double-use pixels 531 and one motion detection double-use pixel 542. The circuit elements configuring the double-use pixel 54 include circuit elements similar to the circuit elements configuring the double-use pixel 53 of the first configuration example. Thus, in the description below, the same reference numeral is assigned to a circuit element similar to the circuit element configuring the double-use pixel 53 of the first configuration example among the circuit elements configuring the double-use pixel 54, and a detailed description thereof will be omitted.

Each of the two ordinary double-use pixels 531 included in the double-use pixel 54 has a configuration similar to the ordinary double-use pixel 531 configured inside the double-use pixel 53 of the first configuration example. In FIG. 14, the two ordinary double-use pixels 531 are discriminated from each other as an ordinary double-use pixel 531a and an ordinary double-use pixel 531b. In FIG. 14, in order to discriminate the circuit elements of the ordinary double-use pixels 531, signs used for discriminating the ordinary double-use pixels 531, in other words, "a" and "b" are assigned following the reference numerals of the circuit elements.

More specifically, the ordinary double-use pixel 531a is configured by a photoelectric conversion device PD12a, a charge transfer transistor 511a, a pixel reset transistor 512a, an amplification transistor 513a, a selection transistor 514a, and node capacitance FD1a. The ordinary double-use pixel 531b is configured by a photoelectric conversion device PD12b, a charge transfer transistor 511b, a pixel reset transistor 512b, an amplification transistor 513b, a selection transistor 514b, and node capacitance FD1b.

The operations and the control timings, which are controlled by the vertical scanning circuit 20, of the ordinary double-use pixel 531a and the ordinary double-use pixel 531b are similar to those of the ordinary double-use pixel 531 configured inside the double-use pixel 53 of the first configuration example, and thus, a detailed description thereof will be omitted.

One motion detection double-use pixel 542 included in the double-use pixel 54 has a configuration same with that of the motion detection double-use pixel 532 configured inside the double-use pixel 53 of the first configuration example. However, in the motion detection double-use pixel 542, one motion detection double-use pixel 542 is served as a plurality of ordinary double-use pixels 531 and the photoelectric conversion device PD12. In the example shown in FIG. 14, one motion detection double-use pixel 542 is served as each of the ordinary double-use pixel 531a and the ordinary double-use pixel 531b of high definition and the photoelectric conversion device PD12. In other words, the motion detection double-use pixel 542 detects the motion of an object on the basis of electric charge signals generated by a plurality of the photoelectric conversion devices PD12. Accordingly, in the motion detection double-use pixel 542, the configuration of circuit elements corresponding to each photoelectric conversion device PD12 is changed.

More specifically, the motion detection double-use pixel 542 has a configuration corresponding to each of the photoelectric conversion devices PD12 used by the amplifier 521 and the bias transistor 522 included in the motion detection double-use pixel 532 of the first configuration example and the capacitor 5231 included in the switched capacitor amplifier circuit 523.

In FIG. 14, by assigning a sign ("a" or "b") assigned to the photoelectric conversion device PD12 to circuit elements corresponding to one of the photoelectric conversion devices PD12 in circuit elements disposed inside the motion detection double-use pixel 542 following the reference signs of the circuit elements, the photoelectric conversion devices PD12 to which the circuit elements correspond are distinguished from each other.

More specifically, the motion detection double-use pixel 542 is configured by a pair of an amplifier 521a and an amplifier 521b; a pair of a bias transistor 522a and a bias transistor 522b; a switched capacitor amplifier circuit 543; a pair of a threshold amplifier 524 and a threshold amplifier 525; and an AER circuit 526. Switched capacitor amplifier circuit 543 is configured by a pair of a capacitor 5231a and a capacitor 5231b; an amplifier 5232; a capacitor 5233; and a switch 5234.

The amplifier 521a amplifies an electric charge signal that is generated and output by the corresponding photoelectric conversion device PD12a and the amplifier 521a outputs the amplified electric charge signal to the capacitor 5231a disposed inside the switched capacitor amplifier circuit 543 through a chip connecting part 13a. The amplifier 521a transmits the amplified electric charge signal to the gate terminal of the bias transistor 522a as a voltage signal Vpa.

The amplifier 521b amplifies an electric charge signal that is generated and output by the corresponding photoelectric conversion device PD12b and the amplifier 521b outputs the amplified electric charge signal to the capacitor 5231b disposed inside the switched capacitor amplifier circuit 543 through a chip connecting part 13b. The amplifier 521b transmits the amplified electric charge signal to the gate terminal of the bias transistor 522b as a voltage signal Vpb.

The bias transistor 522a performs control such that a current flowing through the photoelectric conversion device PD12a in accordance with the voltage signal Vpa transmitted to the gate terminal is a constant current, in other words, even in a case where an electric charge signal generated by the photoelectric conversion device PD12a is changed, the magnitude of the electric charge signal is sequentially stabilized to magnitude after the change. In other words, the output of the photoelectric conversion device PD12a is clipped.

The bias transistor 522b performs control such that a current flowing through the photoelectric conversion device PD12b in accordance with the voltage signal Vpb transmitted to the gate terminal is a constant current, in other words, even in a case where an electric charge signal generated by the photoelectric conversion device PD12b is changed, the magnitude of the electric charge signal is sequentially stabilized to magnitude after the change. In other words, the output of the photoelectric conversion device PD12b is clipped.

The switched capacitor amplifier circuit 543 adds electric charge signals respectively input from the amplifier 521a and the amplifier 521b through chip connecting part 13a and the chip connecting part 13b corresponding thereto. More specifically, the capacitor 5231a accumulates an electric charge signal input from the corresponding amplifier 521a to the first terminal and the capacitor 5231a outputs a voltage signal having a voltage corresponding to the accumulated electric charge signal from the second terminal. The capacitor 5231b accumulates an electric charge signal input from the corresponding amplifier 521b to the first terminal and the capacitor 5231b outputs a voltage signal having a voltage corresponding to the accumulated electric charge signal from the second terminal. At this time, as shown in FIG. 14, since the second terminal of the capacitor 5231a and the second terminal of the capacitor 5231b are connected together, the voltage signal output from the second terminal of the capacitor 5231a and the voltage signal output from the second terminal of the capacitor 5231b are added and output to the amplifier 5232. Then, the switched capacitor amplifier circuit 543, similar to the switched capacitor amplifier circuit 523 included in the double-use pixel 53 of the first configuration example, converts a change in the added electric charge signal, in other words, an increase/decrease in an electric charge signal acquired by adding the electric charge signals generated by the photoelectric conversion device PD12a and the photoelectric conversion device PD12b into a voltage signal of a predetermined voltage range and switched capacitor amplifier circuit 543 outputs the converted voltage signal to the threshold amplifier 524 and the threshold amplifier 525.

According to such a configuration, in the motion detection double-use pixel 542, even in a case where the area of the photoelectric conversion device PD12 included in each ordinary double-use pixel 531 is decreased according to an increase in the definition of the ordinary double-use pixel 531, by adding the electric charge signals generated by a plurality of the photoelectric conversion devices PD12, the motion of an object can be detected on the basis of a larger electric charge signal. Accordingly, in the motion detection double-use pixel 542, the degradation of accuracy of motion detection can be suppressed.

The operation of the motion detection double-use pixel 542 and the control timings controlled by the vertical scanning circuit 20 are similar to those of the motion detection double-use pixel 532 configured inside the double-use pixel 53 of the first configuration example except that the motion detection double-use pixel 542 is operated on the basis of the added electric charge signal and thus, a detailed description thereof will be omitted.

According to such a configuration, in the double-use pixel 54, the image quality of an image generated in ordinary imaging is improved by the high-definition ordinary double-use pixel 531, while the degradation of accuracy of the motion detection can be suppressed by increasing the number of the photoelectric conversion devices PD12 that are served by the motion detection double-use pixels 542.

Then, in the solid-state imaging device 3, the double-use pixels 54 are uniformly arranged in the whole planar area of the pixel array unit 40. At this time, in the solid-state imaging device 3, similar to the time when the double-use pixels 53 of the first configuration example are arranged inside the pixel array unit 40, the photoelectric conversion devices PD12, the reading circuit of each ordinary double-use pixel 531, and the output circuits of the motion detection double-use pixels 542 are formed in the first semiconductor substrate 11, and the reading circuits of the motion detection double-use pixels 542 are formed in the second semiconductor substrate 12.

Figure 15:
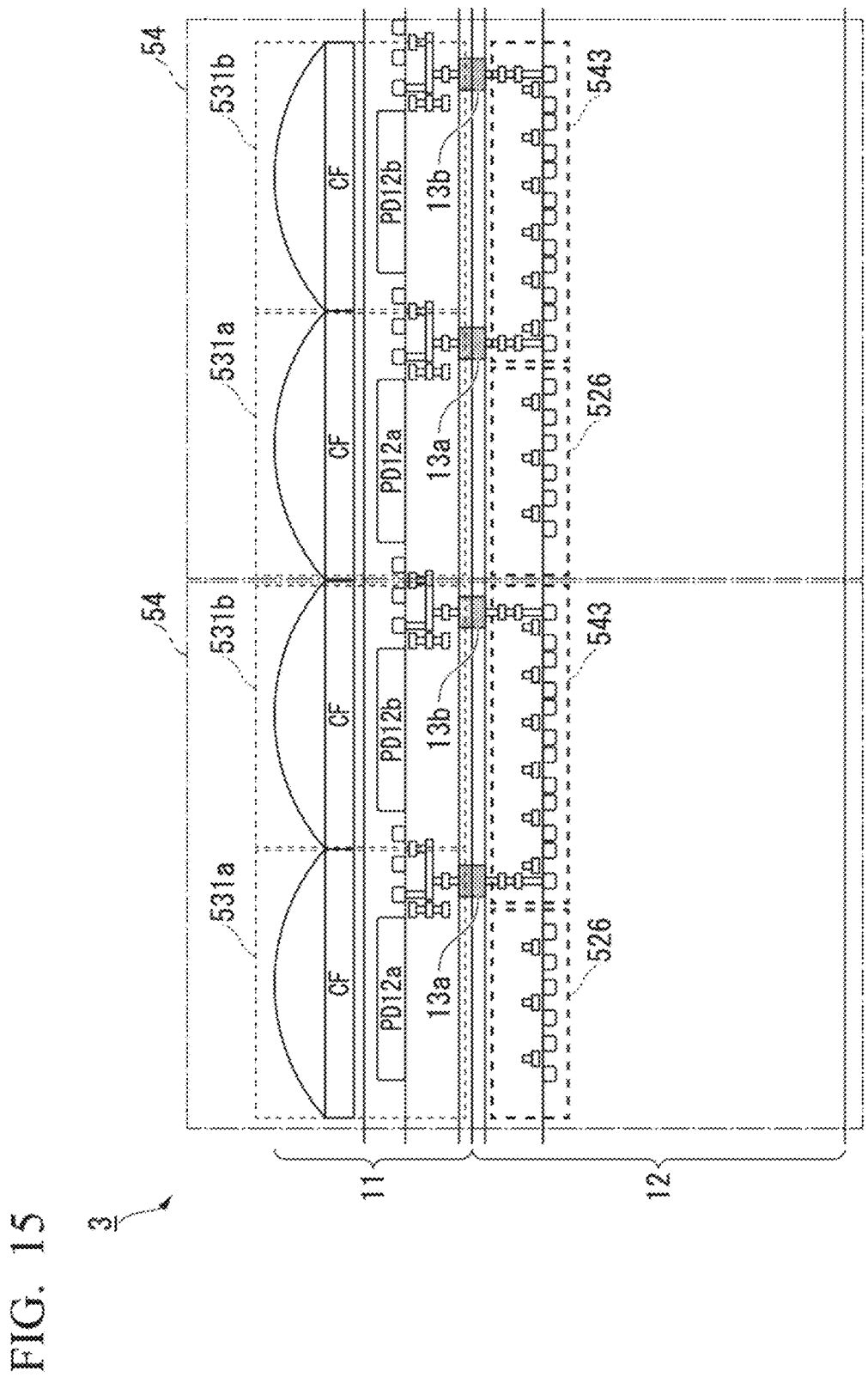
FIG. 15 is a cross-sectional view showing an example of another structure of the solid-state imaging device according to the third embodiment of the present invention.

The structure of the solid-state imaging device 3 according to the third embodiment will be described. FIG. 15 is a cross-sectional view showing an example of another structure of the solid-state imaging device 3 according to the third embodiment of the present invention. FIG. 15 shows the vertical structure of a part of the pixel array unit 40 of a case where the double-use pixels 54 of the second configuration example are arranged in the solid-state imaging device 3.

Specifically, the vertical structure of a part of the pixel array unit 40 in which two double-use pixels 54 are arranged. More specifically, the vertical structure of four ordinary double-use pixels 531 formed in the first semiconductor substrate 11 and two motion detection double-use pixels 542 formed in the first semiconductor substrate 11 and the second semiconductor substrate 12 is shown.

As described above, in the solid-state imaging device 3, each photoelectric conversion device PD12, the reading circuits of the ordinary double-use pixels 531, and the output circuits of the motion detection double-use pixels 542 are formed in the first semiconductor substrate 11, and the reading circuits of the motion detection double-use pixels 542 are formed in the second semiconductor substrate 12. FIG. 15 shows a state in which the switched capacitor amplifier circuit 543 and the AER circuit 526 included in the reading circuit of each motion detection double-use pixel 542 are formed inside the second semiconductor substrate 12.

As described above, in the solid-state imaging device 3, the output circuit corresponding to each photoelectric conversion device PD12 that is served by the motion detection double-use pixel 542 and the switched capacitor amplifier circuit 543 included in the reading circuit of each motion detection double-use pixel 542 are electrically connected using each chip connecting part 13 formed between the first semiconductor substrate 11 and the second semiconductor substrate 12. FIG. 15 shows a state in which the output circuit corresponding to the photoelectric conversion device PD12a included in the ordinary double-use pixel 531a formed in the first semiconductor substrate 11 and the capacitor 5231a disposed inside the switched capacitor amplifier circuit 543 formed in the second semiconductor substrate 12 are connected using the chip connecting part 13a. FIG. 15 shows a state in which the output circuit corresponding to the photoelectric conversion device PD12b included in the ordinary double-use pixel 531b formed in the first semiconductor substrate 11 and the capacitor 5231b disposed inside the switched capacitor amplifier circuit 543 formed in the second semiconductor substrate 12 are connected using the chip connecting part 13b.

In the vertical structure of the solid-state imaging device 3 shown in FIG. 15, while the configuration of the solid-state imaging device 3 in which color filters CF are attached to the side on which light is incident to each double-use pixel 54 is shown, as described above, in the present invention, the colors and the arrangement of the color filters CF attached to the solid-state imaging device 1 are not particularly limited. In other words, in the solid-state imaging device 3, the color filters CF are similar to those of the solid-state imaging device 1 according to the first embodiment and the solid-state imaging device 2 according to the second embodiment.

In this way, in the solid-state imaging device 3 in which the double-use pixels 54 of the second configuration example are arranged, similar to the solid-state imaging device 3 in which the double-use pixels 53 of the first configuration example are arranged, both of the motion detection for sequentially detecting the motion of an object and the ordinary imaging can be realized together. In the solid-state imaging device 3 in which the double-use pixels 54 of the second configuration example are arranged, the image quality of an image generated in ordinary imaging is improved by the high-definition ordinary double-use pixels 531, while the degradation of accuracy of motion detection can be suppressed by the motion detection double-use pixel 542 serving also as a plurality of photoelectric conversion devices PD12.

The configuration of the double-use pixel 54 of the second configuration example shown in FIG. 14 shows a configuration in which one motion detection double-use pixel 542 serves also as two ordinary double-use pixels 531 (the ordinary double-use pixel 531a and the ordinary double-use pixel 531b) and the photoelectric conversion devices PD12 (the photoelectric conversion device PD12a and the photoelectric conversion device PD12b). However, the configuration of the double-use pixel 54 of the second configuration example is not limited to the configuration shown in FIG. 14. In other words, in the double-use pixel 54 of the second configuration example, the number of photoelectric conversion devices PD12 that are also served by one motion detection double-use pixel 542 is not limited to two, which is shown in the case of FIG. 14. For example, in the double-use pixel 54 of the second configuration example, a configuration in which one motion detection double-use pixel 542 serves as four ordinary double-use pixels 531 and the photoelectric conversion device PD12, in other words, a configuration in which the motion detection double-use pixel 542 detects the motion of an object on the basis of an electric charge signal acquired by adding electric charge signals generated by four photoelectric conversion devices PD12 may be employed.

In the solid-state imaging device 3, as described above, the output circuit corresponding to each photoelectric conversion device PD12 also served by the motion detection double-use pixel 542 and the reading circuit of the motion detection double-use pixel 532 are connected using the chip connecting part 13. In the solid-state imaging device 3, as described above, each photoelectric conversion device PD12 is a circuit element configuring the high definition ordinary double-use pixel 531. The area of each photoelectric conversion device PD12 is considered to be decreased according to high definition of the ordinary double-use pixel 531. Accordingly, it is considered that the number of output circuits connected using the chip connecting part 13, in other words, the photoelectric conversion devices PD12 that are doubly used is increased in an area required for forming the reading circuit of the motion detection double-use pixel 542. According to the limit applied at the time of forming the chip connecting parts 13, a limit on the realization of a large number of pixels in the solid-state imaging device 3 may be considered to occur.

Thus, in the solid-state imaging device 3, by changing the method of forming the circuit elements of the double-use pixel 54 in each semiconductor substrate, a configuration may be employed in which the number of chip connecting parts 13 is decreased.

Third Configuration Example

Next, in the solid-state imaging device 3 according to the third embodiment, an example (third configuration example) of a further another configuration of the pixels 50 arranged inside the pixel array unit 40 will be described. The pixel 50 (hereinafter, referred to as a "double-use pixel 55") of the third configuration example is a pixel having a configuration in which the number of required chip connecting parts 13 is decreased in the double-use pixel 54 of the second configuration example in which the definition of the ordinary double-use pixels 531 each generating an electric charge signal through ordinary imaging is increased. The double-use pixel 55, similar to the double-use pixel 54 of the second configuration example, is a pixel having a configuration in which the image quality of an image generated in ordinary imaging is improved, while the degradation of accuracy of motion detection is suppressed.

Figure 16:
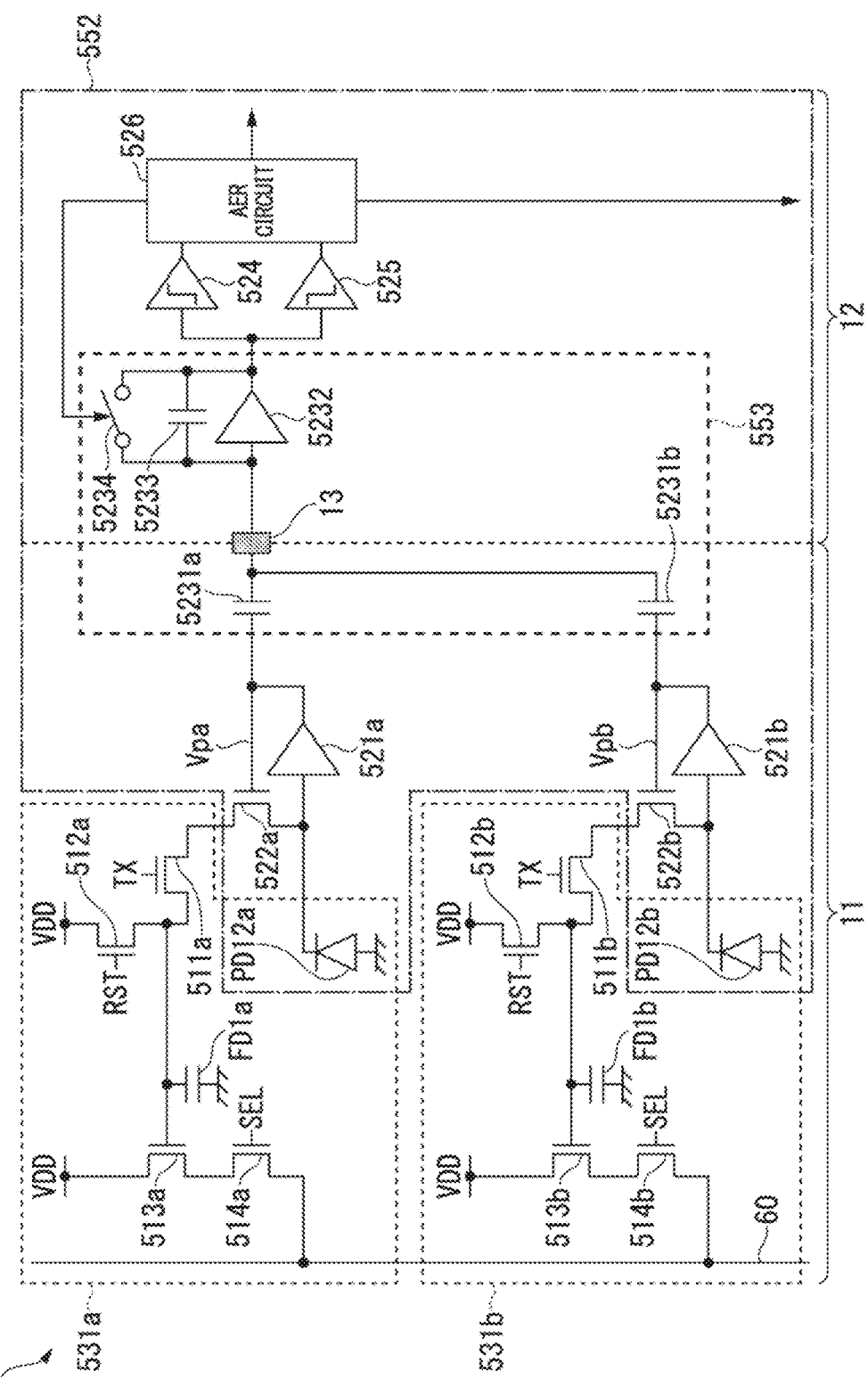
FIG. 16 is a circuit diagram showing further another example of the configuration of a pixel in the solid-state imaging device according to the third embodiment of the present invention.

FIG. 16 is a circuit diagram showing a further another example (third configuration example) of the configuration of a pixel 50 in the solid-state imaging device 3 according to the third embodiment of the present invention. FIG. 16 shows a double-use pixel 55 having a configuration in which, similar to the double-use pixel 54 of the second configuration example, two high-definition ordinary double-use pixels 531 and one motion detection double-use pixel 542 (in the third configuration example, referred to as a "motion detection double-use pixel 552") are included. Circuit elements configuring the double-use pixel 55 include circuit elements similar to the circuit elements configuring the double-use pixel 54 of the second configuration example. Thus, in the description below, the same reference numeral will be assigned to a circuit element similar to the circuit element configuring the double-use pixel 54 of the second configuration example among the circuit elements configuring the double-use pixel 55, and a detailed description thereof will be omitted.

Each of the two ordinary double-use pixels 531 included in the double-use pixel 55 is similar to the ordinary double-use pixel 531 configured inside the double-use pixel 54 of the second configuration example. Thus, a detailed description of the ordinary double-use pixel 531 will be omitted.

One motion detection double-use pixel 552 included in the double-use pixel 55 has a configuration similar to the motion detection double-use pixel 542 configured inside the double-use pixel 54 of the second configuration example. Thus, a reference numeral assigned to the motion detection double-use pixel 552 in FIG. 16 is similar to that of the double-use pixel 54 of the second configuration example. However, in the motion detection double-use pixel 552, in order to decrease the number of chip connecting parts 13, the configuration of the circuit elements included in the motion detection double-use pixel 542 configured inside the double-use pixel 54 of the second configuration example is changed.

More specifically, the motion detection double-use pixel 552 is configured by a pair of an amplifier 521a and an amplifier 521b; a pair of a bias transistor 522a and a bias transistor 522b; a switched capacitor amplifier circuit 553; a pair of a threshold amplifier 524 and a threshold amplifier 525; and an AER circuit 526. The switched capacitor amplifier circuit 553 includes a pair of a capacitor 5231a and a capacitor 5231b, an amplifier 5232, a capacitor 5233, and a switch 5234. In the motion detection double-use pixel 552, the switched capacitor amplifier circuit 543 included in the motion detection double-use pixel 542 configured inside the double-use pixel 54 of the second configuration example is changed to the switched capacitor amplifier circuit 553.

The switched capacitor amplifier circuit 553, similar to the switched capacitor amplifier circuit 543 included in the motion detection double-use pixel 542 configured inside the double-use pixel 54 of the second configuration example, adds electric charge signals respectively input from the amplifier 521a and the amplifier 521b, the switched capacitor amplifier circuit 553 converts a change in the added electric charge signal into a voltage signal in a predetermined voltage range, and the switched capacitor amplifier circuit 553 outputs the converted voltage signal to the threshold amplifier 524 and the threshold amplifier 525. In other words, the switched capacitor amplifier circuit 553 respectively outputs a voltage signal corresponding to an increase/decrease in the electric charge signal acquired by adding the electric charge signals respectively generated by the photoelectric conversion device PD12a and the photoelectric conversion device PD12b to the threshold amplifier 524 and the threshold amplifier 525. Here, the switched capacitor amplifier circuit 553 is formed to be divided into the first semiconductor substrate 11 and the second semiconductor substrate 12.

More specifically, the capacitor 5231a and the capacitor 5231b included in the switched capacitor amplifier circuit 553 are formed in the first semiconductor substrate 11, and the amplifier 5232, the capacitor 5233, and the switch 5234 included in the switched capacitor amplifier circuit 553 are formed in the second semiconductor substrate 12. Accordingly, a signal transmitted by a chip connecting part 13 formed between the first semiconductor substrate 11 and the second semiconductor substrate 12 is a voltage signal having a voltage corresponding to one electric charge signal acquired by adding the electric charge signals respectively input from the amplifier 521a and the amplifier 521b. In other words, in the motion detection double-use pixel 542 configured inside the double-use pixel 54 of the second configuration example, electric charge signals respectively output from the amplifier 521a and the amplifier 521b are transmitted using corresponding chip connecting parts 13, and accordingly, there are two chip connecting parts 13. In contrast to such a configuration, in the switched capacitor amplifier circuit 553, the number of chip connecting parts 13 is decreased to one used for transmitting one voltage signal.

According to such a configuration, in the motion detection double-use pixel 552, even in a case where the area of the photoelectric conversion device PD12 included in each ordinary double-use pixel 531 is further decreased according to an increase in the definition of the ordinary double-use pixel 531, by adding the electric charge signals generated by a plurality of the photoelectric conversion devices PD12, the motion of an object can be detected on the basis of a larger electric charge signal such that the degradation of accuracy of motion detection can be suppressed.

The operation of the motion detection double-use pixel 552 and the control timings controlled by the vertical scanning circuit 20 are similar to those of the double-use pixel 54 of the second configuration example, in other words, the motion detection double-use pixel 532 configured inside the double-use pixel 53 of the first configuration example, and thus, a detailed description thereof will be omitted.

According to such a configuration, in the double-use pixel 55, similar to the double-use pixel 54 of the second configuration example, the image quality of an image generated in ordinary imaging is improved, the degradation of accuracy of motion detection is suppressed, and furtherly the number of chip connecting parts 13 formed between the first semiconductor substrate 11 and the second semiconductor substrate 12 can be decreased.

In the solid-state imaging device 3, the double-use pixels 55 are uniformly arranged in the whole planar area of the pixel array unit 40. At this time, in the solid-state imaging device 3, similar to the time when the double-use pixels 54 of the second configuration example are arranged inside the pixel array unit 40, each photoelectric conversion device PD12, the reading circuit of each ordinary double-use pixel 531, the output circuit of the motion detection double-use pixel 552, and some circuit elements (the capacitor 5231a and the capacitor 5231b included in the switched capacitor amplifier circuit 553) of the reading circuit of the motion detection double-use pixel 552 are formed in the first semiconductor substrate 11. In the solid-state imaging device 3, similar to the time when the double-use pixels 54 of the second configuration example are arranged inside the pixel array unit 40, the remaining circuit elements of the reading circuit of the motion detection double-use pixel 552 are formed in the second semiconductor substrate 12.

In this way, by arranging the double-use pixels 55 of the third configuration example inside the pixel array unit 40, in the solid-state imaging device 3, the number of chip connecting parts 13 formed between the first semiconductor substrate 11 and the second semiconductor substrate 12 can be decreased than that of the case where the double-use pixels 54 of the second configuration example are arranged inside the pixel array unit 40. Accordingly, in the solid-state imaging device 3, even in a case where the definition of the ordinary double-use pixel 531 is further increased to realize a larger number of pixels, the occurrence of a limit for the realization of high-definition pixels of the solid-state imaging device 3 in accordance with the limit at the time of formation of the chip connecting parts 13 can be suppressed. In other words, the solid-state imaging device 3 in which the double-use pixels 55 of the third configuration example are arranged inside the pixel array unit 40 can be easily manufactured.

The structure of the solid-state imaging device 3 of a case where the double-use pixels 55 of the third configuration example are arranged can be considered to be similar to the structure of the solid-state imaging device 3 of a case where the double-use pixels 54 of the second configuration example shown in FIG. 15 are arranged, and thus, a detailed description thereof will be omitted.

Also in the configuration of the double-use pixel 55 of the third configuration example shown in FIG. 16, a configuration is shown in which one motion detection double-use pixel 552 serves as two ordinary double-use pixels 531 (the ordinary double-use pixel 531a and the ordinary double-use pixel 531b) and the photoelectric conversion devices PD12 (the photoelectric conversion device PD12a and the photoelectric conversion device PD12b). However, in the configuration of the double-use pixel 55 of the third configuration example, similar to the double-use pixel 54 of the second configuration example, the number of pixels served by one motion detection double-use pixel 552 is not limited.

In the double-use pixel 55 of the third configuration example, while the number of required chip connecting parts 13 is decreased in the double-use pixel 54 of the second configuration example, the ordinary double-use pixels 531 configured inside the double-use pixel 55 can be configured to be high definition, in other words, the number of the ordinary double-use pixels 531 arranged inside the pixel array unit 40 can be increased up to a range in which an area required for the formation of reading circuits of the motion detection double-use pixels 552 can be secured. This represents that, in the double-use pixel 55 of the third configuration example, similar to the double-use pixel 54 of the second configuration example, while higher definition of the ordinary double-use pixels 531 than that of the case of the double-use pixel 53 of the first configuration example is realized, in a case where implementation of further higher definition of the ordinary double-use pixels 531 is performed, the size of an area used for forming the motion detection double-use pixel 542 and the reading circuit of the motion detection double-use pixel 552 cause a problem at the time of realizing high definition. This is not limited to the double-use pixel 55 of the third configuration example but similarly applies also to the double-use pixel 54 of the second configuration example.

Thus, in the solid-state imaging device 3, by changing the method of forming the circuit elements of the double-use pixels formed in each semiconductor substrate, an area required for forming the reading circuit of the motion detection double-use pixel can be decreased. In other words, a projection area of the area in which the reading circuit of the motion detection double-use pixel is formed when seen from the side on which light is incident to the double-use pixel may be decreased.

Fourth Configuration Example

Figure 17:
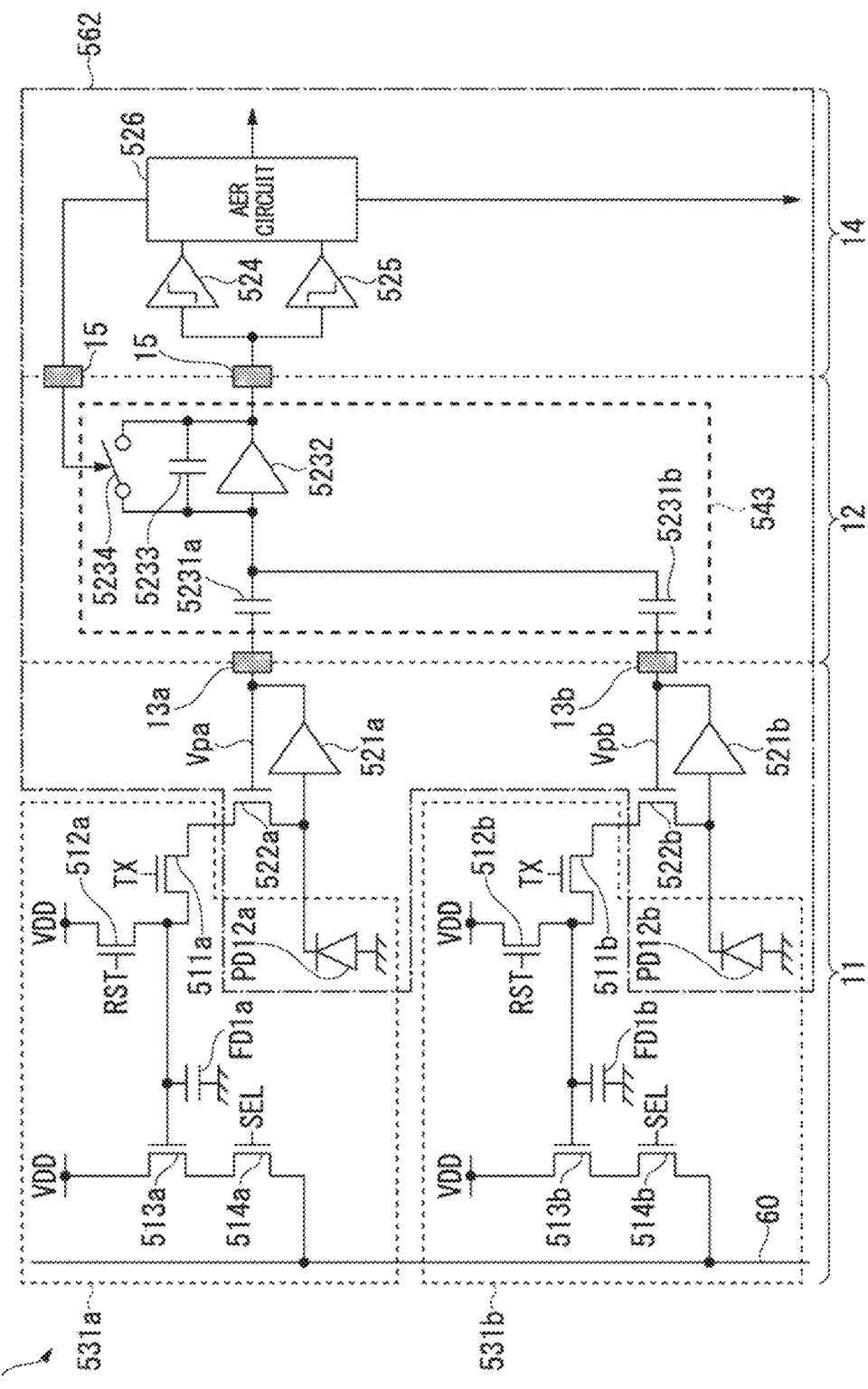
FIG. 17 is a circuit diagram showing further another example of the configuration of a pixel in the solid-state imaging device according to the third embodiment of the present invention.

Next, in the solid-state imaging device 3 according to the third embodiment, further another example (fourth configuration example) of the pixels 50 arranged inside the pixel array unit 40 will be described. In the description below, a case where the consideration of the fourth configuration example is applied to the double-use pixel 54 of the second configuration example will be described. A case where the consideration of the fourth configuration example is applied to the double-use pixel 55 of the third configuration example may be similarly considered FIG. 17 is a circuit diagram showing further another example (fourth configuration example) of the configuration of the pixels 50 of the solid-state imaging device 3 according to the third embodiment of the present invention. The pixel 50 (hereinafter, referred to as a "double-use pixel 56") of the fourth configuration example is a pixel configured to decrease a projection area of an area required for the formation of a reading circuit of the motion detection double-use pixel 542 in the double-use pixel 54 of the second configuration example in which the definition of the ordinary double-use pixel 531 generating an electric charge signal through ordinary imaging is increased. The double-use pixel 56, similar to the double-use pixel 54 of the second configuration example, is a pixel configured to improve the image quality of an image generated in ordinary imaging and suppress degradation of accuracy of motion detection.

FIG. 17, similar to the double-use pixel 54 of the second configuration example, shows the double-use pixel 56 having a configuration in which two high-definition ordinary double-use pixels 531 and one motion detection double-use pixel 562 are included. Circuit elements configuring the double-use pixel 56 include circuit elements similar to the circuit elements configuring the double-use pixel 54 of the second configuration example. Thus, in the description below, the same reference numeral will be assigned to a circuit element similar to the circuit element configuring the double-use pixel 54 of the second configuration example among the circuit elements configuring the double-use pixel 56, and a detailed description thereof will be omitted.

Each of the two ordinary double-use pixels 531 included in the double-use pixel 56 is similar to the ordinary double-use pixel 531 configured inside the double-use pixel 54 of the second configuration example. Thus, a detailed description of the ordinary double-use pixel 531 will be omitted.

One motion detection double-use pixel 562 included in the double-use pixel 56 has a configuration similar to the motion detection double-use pixel 542 configured inside the double-use pixel 54 of the second configuration example. Thus, a reference numeral assigned to the motion detection double-use pixel 562 in FIG. 17 is similar to that of the double-use pixel 54 of the second configuration example. However, in the double-use pixel 56 of the fourth configuration example, in order to decrease the projection area of the motion detection double-use pixel 562 when seen from the side on which light is incident to the double-use pixel 56, the circuit elements of the reading circuit of the motion detection double-use pixel 562 are formed to be divided into other semiconductor substrates.

More specifically, the output circuit of the motion detection double-use pixel 562 configured inside the double-use pixel 56, similar to the output circuit of the motion detection double-use pixel 542 configured inside the double-use pixel 54 of the second configuration example, is formed in a first semiconductor substrate 11. In the double-use pixel 56, the switched capacitor amplifier circuit 543 included in the reading circuit of the motion detection double-use pixel 562 configured inside the double-use pixel 56 is formed in a second semiconductor substrate 12, and the threshold amplifier 524 and the threshold amplifier 525, and the AER circuit 526 included in the reading circuit of the motion detection double-use pixel 562 are formed in a third semiconductor substrate 14.

In the double-use pixel 56, the switched capacitor amplifier circuit 543 formed in the second semiconductor substrate 12 and the threshold amplifier 524, the threshold amplifier 525, and the AER circuit 526 formed in the third semiconductor substrate 14 are electrically connected using chip connecting parts 15 formed between the second semiconductor substrate 12 and the third semiconductor substrate 14.

Accordingly, the projection area when seen from the side on which light is incident to the double-use pixel 562 in the motion detection double-use pixel 56 configured by many circuit elements can be decreased. In other words, the total projection area of the double-use pixel 56 can be decreased.

Also in the double-use pixel 56 of the fourth configuration example, each photoelectric conversion device PD12 and the reading circuit of each ordinary double-use pixel 531 configured inside the double-use pixel 56, similar to the time when the double-use pixels 54 of the second configuration example are arranged inside the pixel array unit 40, are formed in the first semiconductor substrate 11.

Accordingly, the solid-state imaging device 3 in which the double-use pixel 56 of the fourth configuration example is arranged inside the pixel array unit 40 has a configuration in which the first semiconductor substrate 11, the second semiconductor substrate 12, and the third semiconductor substrate 14 are stacked (bonded) in this order. More specifically, in the solid-state imaging device 3 in which the double-use pixel 56 of the fourth configuration example is arranged inside the pixel array unit 40, the second semiconductor substrate 12 is stacked on an opposite surface to a surface on which light is incident to the first semiconductor substrate 11, the first semiconductor substrate 11 including the photoelectric conversion device PD12, the reading circuit of the ordinary double-use pixel 531 configured inside the double-use pixel 56, and the output circuit of the motion detection double-use pixel 562 configured inside the double-use pixel 56. The solid-state imaging device 3 in which the double-use pixel 56 of the fourth configuration example is arranged inside the pixel array unit 40, the third semiconductor substrate 14 is stacked on a surface of the second semiconductor substrate 12 that is disposed on a side opposite to the surface on which the first semiconductor substrate 11 is stacked.

According to such a configuration, in the motion detection double-use pixel 562, even in a case where the area of the photoelectric conversion device PD12 included in each ordinary double-use pixel 531 is further decreased according to an increase in the definition of the ordinary double-use pixel 531, similar to the motion detection double-use pixel 542 configured inside the double-use pixel 54 of the second configuration example, the motion of an object can be detected on the basis of a larger electric charge signal, and the degradation of accuracy of motion detection can be suppressed.

The operation of the motion detection double-use pixel 562 and the control timings controlled by the vertical scanning circuit 20 are similar to those of the double-use pixel 54 of the second configuration example, in other words, the motion detection double-use pixel 532 configured inside the double-use pixel 53 of the first configuration example, and thus, a detailed description thereof will be omitted.

According to such a configuration, in the double-use pixel 56, similar to the double-use pixel 54 of the second configuration example, the image quality of an image generated in ordinary imaging is improved, and the total projection area of the double-use pixel 56 when seen from the side on which light is incident to the double-use pixel 56 can be decreased.

In the solid-state imaging device 3, the double-use pixels 56 are uniformly arranged in the whole planar area of the pixel array unit 40. At this time, in the solid-state imaging device 3, the motion detection double-use pixel 562 arranged inside the pixel array unit 40 is formed to be divided into the first semiconductor substrate 11, the second semiconductor substrate 12, and the third semiconductor substrate 14.

In this way, by arranging the double-use pixel 56 of the fourth configuration example inside the pixel array unit 40, in the solid-state imaging device 3, similar to the case where the double-use pixel 54 of the second configuration example is arranged inside the pixel array unit 40, both of the motion detection sequentially detecting the motion of an object and the ordinary imaging can be realized together. In the solid-state imaging device 3, similar to the case where the double-use pixels 54 of the second configuration example are arranged inside the pixel array unit 40, the image quality of an image generated in ordinary imaging is improved by the high-definition ordinary double-use pixel 531, while the degradation of accuracy of the motion detection can be suppressed by allowing the motion detection double-use pixel 562 to serve also as a plurality of photoelectric conversion devices PD12. In the solid-state imaging device 3 in which the double-use pixels 56 of the fourth configuration example are arranged, higher definition of the ordinary double-use pixels 531 and a decrease in the size of the solid-state imaging device 3 can be easily realized.

The structure of the solid-state imaging device 3 of a case where the double-use pixels 56 of the fourth configuration example are arranged is a structure in which the third semiconductor substrate 14 is furtherly stacked (bonded) to the structure of the solid-state imaging device 3 of a case where the double-use pixels 54 of the second configuration example shown in FIG. 15 are arranged. Since the structure of the solid-state imaging device 3 of a case where the double-use pixels 56 of the fourth configuration example are arranged can be similarly considered as the structure of the solid-state imaging device 3 of a case where the double-use pixels 54 of the second configuration example shown in FIG. 15 are arranged, a detailed description thereof will be omitted.

In the configuration of the double-use pixels 56 of the fourth configuration example shown in FIG. 17, a configuration in which one motion detection double-use pixels 562 serves as two ordinary double-use pixels 531 (the ordinary double-use pixel 531a and the ordinary double-use pixel 531b) and the photoelectric conversion device PD12 (the photoelectric conversion device PD12a and the photoelectric conversion device PD12b) is shown. However, in the configuration of the double-use pixel 56 of the fourth configuration example, similar to the double-use pixel 54 of the second configuration example and the double-use pixel 55 of the third configuration example, the number of pixels served by one motion detection double-use pixel 562 is not particularly limited.

In the configuration of the double-use pixel 56 of the fourth configuration example shown in FIG. 17, a configuration is shown in which the motion detection double-use pixel 562 is formed to be divided into the first semiconductor substrate 11, the second semiconductor substrate 12, and the third semiconductor substrate 14. However, the method of dividing the motion detection double-use pixel 562 into the semiconductor substrates is not particularly limited to the method shown in FIG. 17. In other words, the configuration is not limited to a configuration in which the motion detection double-use pixels 562 configured inside the double-use pixel 56 of the fourth configuration example are divided into three semiconductor substrates but may be configured to be divided into more semiconductor substrates. For example, the motion detection double-use pixel 562 may be formed to be divided into four semiconductor substrates. In such a case, for example, the output circuit of the motion detection double-use pixels 562 may be formed in the first semiconductor substrate 11, the switched capacitor amplifier circuit 543 included in the reading circuit of the motion detection double-use pixels 562 may be formed in the second semiconductor substrate 12, the threshold amplifier 524 and the threshold amplifier 525 may be formed in the third semiconductor substrate 14, and the AER circuit 526 may be formed in the fourth semiconductor substrate.

According to the third embodiment, a solid-state imaging device (the solid-state imaging device 3) is configured in which a connection part (the chip connecting part 13) that is formed between the first semiconductor substrate (the first semiconductor substrate 11) and the second semiconductor substrate (second semiconductor substrate 12) and electrically connects a circuit element of the first semiconductor substrate 11 and a circuit element of the second semiconductor substrate 12 is further included, the second photoelectric conversion devices (the photoelectric conversion devices PD2 included in the motion detection pixels 52 of the solid-state imaging device 1 according to the first embodiment or the solid-state imaging device 2 according to the second embodiment) are the first photoelectric conversion devices (the photoelectric conversion devices PD1: the photoelectric conversion devices PD12 included in the ordinary pixels 51 of the solid-state imaging device 1 according to the first embodiment or the solid-state imaging device 2 according to the second embodiment), each of the m second reading circuits (the reading circuits of the motion detection double-use pixels) sequentially outputs the second pixel signal (the event pixel signal) indicating a change in the first electric charge signal generated by corresponding s photoelectric conversion devices PD12 among the n photoelectric conversion devices PD12, the detection circuit (the threshold amplifier 524 and the threshold amplifier 525) included in each of the reading circuits of the m motion detection double-use pixels detects a temporal change in the first electric charge signal generated by corresponding s photoelectric conversion devices PD12 and outputs the event signal when a change exceeding a predetermined threshold is detected, the chip connecting part 13 electrically connects the threshold amplifier 524 and the threshold amplifier 525 included in each of the reading circuits of the m motion detection double-use pixels and corresponding s photoelectric conversion devices PD12, and s is a natural number equal to 1 or more than 1.

According to the third embodiment, a solid-state imaging device 3 is configured in which m is smaller than n, s is a natural number equal to 2 or more than 2, each of the reading circuits of the m motion detection double-use pixels further includes an addition circuit (the capacitor 5231a and the capacitor 5231b) that adds the first electric charge signals generated by the corresponding s photoelectric conversion devices PD12, and the threshold amplifier 524 and the threshold amplifier 525 detect a change in the first electric charge signal after the addition performed by the capacitor 5231a and the capacitor 5231b.

According to the third embodiment, a solid-state imaging device 3 is configured in which each of the reading circuits of the m motion detection double-use pixels further includes an amplification circuit (switched capacitor amplifier circuit) that is arranged in the second semiconductor substrate 12 and amplifies the first electric charge signal after the addition performed by the capacitor 5231a and the capacitor 5231b, and the threshold amplifier 524 and the threshold amplifier 525 detect a change in the first electric charge signal after the amplification performed by the switched capacitor amplifier circuit.

According to the third embodiment, a solid-state imaging device 3 is configured in which the capacitor 5231a and the capacitor 5231b are arranged in the first semiconductor substrate 11, and the chip connecting part 13 electrically connects the threshold amplifier 524 and the threshold amplifier 525 included in each reading circuit of the m motion detection double-use pixels and corresponding capacitors 5231a and 5231b.

As described above, in the solid-state imaging device 3 according to the third embodiment, the double-use pixels performing output of a pixel signal through ordinary imaging and output of an event pixel signal through motion detection on the basis of an electric charge signal generated by the same photoelectric conversion device PD12 are uniformly arranged in the whole planar area of the pixel array unit 40. At this time, in the solid-state imaging device 3 according to the third embodiment, similar to the solid-state imaging device 1 according to the first embodiment and the solid-state imaging device 2 according to the second embodiment, the ordinary double-use pixel configured inside the double-use pixel for outputting a pixel signal through ordinary imaging is formed in the first substrate 11, and the motion detection double-use pixel configured inside the double-use pixel for outputting an event pixel signal through motion detection is formed in the second semiconductor substrate 12. Accordingly, in the solid-state imaging device 3 according to the third embodiment, similar to the solid-state imaging device 1 according to the first embodiment and the solid-state imaging device 2 according to the second embodiment, both of the ordinary imaging and the motion detection for sequentially detecting the motion of an object can be realized together.

In the solid-state imaging device 3 according to the third embodiment, by using the motion detection double-use pixel as a plurality of the ordinary double-use pixels and the photoelectric conversion device PD12, and by adding electric charge signals generated by a plurality of the photoelectric conversion devices PD12 together, the motion of an object can be detected on the basis of a larger electric charge signal. Accordingly, also in the solid-state imaging device 3 according to the third embodiment, similar to the solid-state imaging device 1 according to the first embodiment and the solid-state imaging device 2 according to the second embodiment, the motion detection double-use pixel arranged inside the pixel array unit 40 can suppress degradation of accuracy of motion detection. In such a case, also in the solid-state imaging device 3 according to the third embodiment, similar to the solid-state imaging device 1 according to the first embodiment and the solid-state imaging device 2 according to the second embodiment, the number of ordinary double-use pixels arranged inside the pixel array unit 40 can be configured to be more than the number of motion detection double-use pixels, and the image quality of an image generated in ordinary imaging can be improved.

As described above, according to each embodiment of the present invention, as pixels included in the solid-state imaging device, pixels each outputting a pixel signal of ordinary imaging and pixels each outputting an event pixel signal of motion detection are arranged in a pixel array unit. Accordingly, in each embodiment of the present invention, both of the ordinary imaging and the motion detection for sequentially detecting the motion of an object can be realized together.

In each embodiment of the present invention, the number of pixels, which are arranged in the pixel array unit, each outputting a pixel signal of ordinary imaging is configured to be larger than the number of pixels each outputting an event pixel signal of motion detection. Accordingly, in each embodiment of the present invention, the image quality of an image generated in the ordinary imaging can be improved.

In each embodiment of the present invention, an electric charge signal generated by the photoelectric conversion device included in each pixel outputting an event pixel signal of the motion detection is configured to be larger. Accordingly, in each embodiment of the present invention, degradation of accuracy of motion detection detecting the motion of an object can be suppressed.

In a solid-state imaging device according to each embodiment of the present invention, two semiconductor substrates may be connected using chip connecting parts, or three or more semiconductor substrates may be connected using chip connecting parts. In the case of a solid-state imaging device in which three or more semiconductor substrates are connected using chip connecting parts, two semiconductor substrates among the semiconductor substrates correspond to a first semiconductor substrate and a second semiconductor substrate according to the claims.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A solid-state imaging device comprising:
   a first semiconductor substrate to which light is incident;
   a second semiconductor substrate that is stacked on a surface of the first semiconductor substrate, the surface being opposite with respect to a surface on which the light is incident to the first semiconductor substrate;
   n first photoelectric conversion devices that are periodically arranged in the first semiconductor substrate, the n first photoelectric conversion devices generating first electric charge signals by performing photoelectric conversion of the incident light;
   n first reading circuits arranged in correspondence with each of the n first photoelectric conversion devices in the first semiconductor substrate, each of the n first reading circuits accumulating the first electric charge signal generated by a corresponding one of then first photoelectric conversion devices, and each of the n first reading circuits outputting a signal voltage corresponding to the accumulated first electric charge signal as a first pixel signal;
   a driving circuit that outputs the first pixel signal by sequentially driving each of the n first reading circuits;
   m second photoelectric conversion devices that are periodically arranged in one of the first semiconductor substrate and the second semiconductor substrate, the m second photoelectric conversion devices generating second electric charge signals by performing photoelectric conversion of the incident light; and
   m second reading circuits that sequentially output a second pixel signal indicating a change in the second electric charge signal, the second electric charge signal being generated by a corresponding second photoelectric conversion device among the m second photoelectric conversion devices,
   wherein each of the m second reading circuits includes:
      a detection circuit that detects a temporal change of the second electric charge signal generated by the corresponding one of the second photoelectric conversion devices and the detection circuit outputs an event signal indicating a direction of a change when a change exceeding a predetermined threshold is detected; and
      a pixel signal generating circuit that is arranged in the second semiconductor substrate and the pixel signal generating circuit outputs the second pixel signal, the second pixel signal being generated by adding address information indicating a position at which the corresponding one of the second photoelectric conversion devices is arranged to the event signal,
   wherein n is a natural number equal to 2 or more than 2, and
   wherein m is a natural number equal to 2 or more than 2.

2. The solid-state imaging device according to claim 1,
   wherein each of the m second reading circuits further includes an amplification circuit that is arranged in the second semiconductor substrate, the amplification circuit amplifying the second electric charge signal generated by the corresponding one of the second photoelectric conversion devices, and
   wherein the detection circuit detects a change in the second electric charge signal after being amplified by the amplification circuit.

3. The solid-state imaging device according to claim 1,
   wherein m is smaller than n, and
   wherein an area in which each of the m second photoelectric conversion devices receives the light is larger than an area in which each of the n first photoelectric conversion devices receives the light.

4. The solid-state imaging device according to claim 1,
   wherein each of the m second photoelectric conversion devices is arranged in the second semiconductor substrate, and each of the m second photoelectric conversion devices generates the second electric charge signal by performing the photoelectric conversion of light transmitted through corresponding p first photoelectric conversion devices among the n first photoelectric conversion devices, and
   wherein p is a natural number equal to 1 or more than 1.

5. The solid-state imaging device according to claim 1, further comprising a connection part that is formed between the first semiconductor substrate and the second semiconductor substrate, the connection part electrically connecting a circuit element of the first semiconductor substrate and a circuit element of the second semiconductor substrate, wherein m is smaller than n, wherein each of the m second photoelectric conversion devices is arranged in the first semiconductor substrate, and wherein the connection part electrically connects the detection circuit included in each of them second reading circuits and corresponding one of the second photoelectric conversion devices.

6. The solid-state imaging device according to claim 1, further comprising a connection part that is formed between the first semiconductor substrate and the second semiconductor substrate, the connection part electrically connecting a circuit element of the first semiconductor substrate and a circuit element of the second semiconductor substrate, wherein the second photoelectric conversion devices are the first photoelectric conversion devices, wherein each of the m second reading circuits sequentially outputs the second pixel signal indicating a change in the first electric charge signal, the first electric charge signal being generated by corresponding s first photoelectric conversion devices among the n first photoelectric conversion devices, wherein the detection circuit included in each of the m second reading circuits detects a temporal change in the first electric charge signal, the first electric charge signal being generated by corresponding s first photoelectric conversion devices, and the detection circuit outputs the event signal when the temporal change exceeding a predetermined threshold is detected, wherein the connection part electrically connects the detection circuit included in each of them second reading circuits and corresponding s first photoelectric conversion devices, and wherein s is a natural number equal to 1 or more than 1.

7. The solid-state imaging device according to claim 6, wherein m is smaller than n, wherein s is a natural number equal to 2 or more than 2, wherein each of the m second reading circuits furtherly includes an addition circuit that adds each of the first electric charge signals, the first electric charge signals being generated by the corresponding s first photoelectric conversion devices, and wherein the detection circuit detects a change in the first electric charge signal after the addition performed by the addition circuit.

8. The solid-state imaging device according to claim 7, wherein each of the m second reading circuits furtherly includes an amplification circuit that is arranged in the second semiconductor substrate and the amplification circuit amplifies the first electric charge signal after the addition performed by the addition circuit, and wherein the detection circuit detects a change in the first electric charge signal after the amplification performed by the amplification circuit.

9. The solid-state imaging device according to claim 7, wherein the addition circuit is arranged in the first semiconductor substrate, and wherein the connection part electrically connects the detection circuit included in each of them second reading circuits and a corresponding addition circuit.

* * * * *

UNITED STATES PATENT AND TRADEMARK OFFICE
CERTIFICATE OF CORRECTION

PATENT NO. : 10,218,922 B2  
APPLICATION NO. : 15/865705  
DATED : February 26, 2019  
INVENTOR(S) : Toru Kondo et al.

Page 1 of 1

It is certified that error appears in the above-identified patent and that said Letters Patent is hereby corrected as shown below:

On the Title Page

Item [63], insert:  
--Continuation of application No. PCT/JP2015/070129, Filed on July 14, 2015--

Signed and Sealed this  
Second Day of July, 2019

Andrei Iancu  
*Director of the United States Patent and Trademark Office*